(12) United States Patent
Yoshimoto et al.

(10) Patent No.: US 12,490,513 B2
(45) Date of Patent: Dec. 2, 2025

(54) SEMICONDUCTOR DEVICE, DISPLAY DEVICE, AND ELECTRONIC DEVICE

(71) Applicant: SEMICONDUCTOR ENERGY LABORATORY CO., LTD., Atsugi (JP)

(72) Inventors: Satoshi Yoshimoto, Kanagawa (JP); Koji Kusunoki, Kanagawa (JP); Kazunori Watanabe, Tokyo (JP); Susumu Kawashima, Kanagawa (JP); Marina Hiyama, Ibaraki (JP); Motoharu Saito, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/767,164

(22) Filed: Jul. 9, 2024

(65) Prior Publication Data
US 2024/0379690 A1 Nov. 14, 2024

Related U.S. Application Data

(63) Continuation of application No. 18/022,329, filed as application No. PCT/IB2021/057541 on Aug. 17, 2021, now Pat. No. 12,040,333.

(30) Foreign Application Priority Data

Aug. 27, 2020 (JP) .................. 2020-143219

(51) Int. Cl.
*G09G 3/20* (2006.01)
*H01L 27/12* (2006.01)
(Continued)

(52) U.S. Cl.
CPC ............. *H10D 86/423* (2025.01); *G09G 3/20* (2013.01); *H10D 86/451* (2025.01);
(Continued)

(58) Field of Classification Search
CPC .................. H01L 27/1248; G09G 3/20; G09G 2300/0426; G09G 2310/0286;
(Continued)

(56) References Cited

U.S. PATENT DOCUMENTS

| 4,633,438 A | 12/1986 | Kume et al. |
| 4,902,637 A | 2/1990 | Kondou et al. |

(Continued)

FOREIGN PATENT DOCUMENTS

| CN | 107799521 A | 3/2018 |
| JP | 2001-325798 A | 11/2001 |

(Continued)

OTHER PUBLICATIONS

International Search Report (Application No. PCT/IB2021/057541) Dated Nov. 22, 2021.

(Continued)

*Primary Examiner* — Lixi C Simpson
(74) *Attorney, Agent, or Firm* — Fish & Richardson P.C.

(57) ABSTRACT

A highly functional semiconductor device is provided. The semiconductor device includes a first transistor and a second transistor. The first transistor includes a first semiconductor layer, a first gate electrode, a first electrode, and a second electrode. The second transistor includes a second semiconductor layer, a second gate electrode, a third electrode, and a fourth electrode. The first gate electrode and the second gate electrode are connected to each other, and the second electrode and the third electrode are connected to each other. A first insulating layer, a second insulating layer, and a second semiconductor layer are stacked over the first semiconductor layer. The first insulating layer is less likely to diffuse hydrogen than the second insulating layer. The second insulating layer contains oxide, the first semiconductor layer contains polycrystalline silicon, and the second (Continued)

semiconductor layer contains a metal oxide. The first transistor is a p-channel transistor and the second transistor is an n-channel transistor.

12 Claims, 17 Drawing Sheets

(51) Int. Cl.
*H10D 86/40* (2025.01)
*H10D 86/60* (2025.01)

(52) U.S. Cl.
CPC ..... *H10D 86/60* (2025.01); *G09G 2300/0426* (2013.01); *G09G 2310/0286* (2013.01); *G09G 2310/0291* (2013.01); *G09G 2310/08* (2013.01); *G09G 2330/021* (2013.01)

(58) Field of Classification Search
CPC ....... G09G 2310/0291; G09G 2310/08; G09G 2330/021
See application file for complete search history.

(56) References Cited

U.S. PATENT DOCUMENTS

| | | | |
|---|---|---|---|
| 5,208,476 | A | 5/1993 | Inoue |
| 5,526,304 | A | 6/1996 | Kawamura |
| 5,675,160 | A | 10/1997 | Oikawa |
| 5,940,705 | A | 8/1999 | Lee et al. |
| 6,127,702 | A | 10/2000 | Yamazaki et al. |
| 6,515,511 | B2 | 2/2003 | Sugibayashi et al. |
| 6,928,136 | B2 | 8/2005 | Nagao et al. |
| 6,975,142 | B2 | 12/2005 | Azami et al. |
| 7,038,653 | B2 | 5/2006 | Moon |
| 7,057,598 | B2 | 6/2006 | Azami et al. |
| 7,068,076 | B2 | 6/2006 | Azami |
| 7,521,715 | B2 | 4/2009 | Jang et al. |
| 7,826,266 | B2 | 11/2010 | Ishii |
| 8,067,775 | B2 | 11/2011 | Miyairi et al. |
| 8,188,477 | B2 | 5/2012 | Miyairi et al. |
| 8,232,598 | B2 | 7/2012 | Yamazaki et al. |
| 8,284,142 | B2 | 10/2012 | Yamazaki et al. |
| 8,441,047 | B2 | 5/2013 | Godo et al. |
| 8,455,876 | B2 | 6/2013 | Choi et al. |
| 8,471,620 | B2 | 6/2013 | Koyama et al. |
| 8,518,739 | B2 | 8/2013 | Miyairi et al. |
| 8,698,521 | B2 | 4/2014 | Nishijima |
| 8,809,850 | B2 | 8/2014 | Yamazaki |
| 8,902,144 | B2 | 12/2014 | Umezaki |
| 9,001,959 | B2 | 4/2015 | Koyama |
| 9,018,629 | B2 | 4/2015 | Tezuka et al. |
| 9,036,766 | B2 | 5/2015 | Umezaki |
| 9,093,988 | B2 | 7/2015 | Yamazaki et al. |
| 9,111,795 | B2 | 8/2015 | Ieda et al. |
| 9,117,713 | B2 | 8/2015 | Koyama |
| 9,236,377 | B2 | 1/2016 | Kimura et al. |
| 9,293,099 | B2 | 3/2016 | Murakami et al. |
| 9,324,874 | B2 | 4/2016 | Yamazaki et al. |
| 9,424,950 | B2 | 8/2016 | Toyotaka et al. |
| 9,494,830 | B2 | 11/2016 | Yamazaki et al. |
| 9,860,465 | B2 | 1/2018 | Ohmaru |
| 9,939,692 | B2 | 4/2018 | Yamazaki et al. |
| 10,032,841 | B2 | 7/2018 | Tsai et al. |
| 10,074,576 | B2 | 9/2018 | Kato |
| 10,147,747 | B2 | 12/2018 | Toriumi et al. |
| 10,629,147 | B2 | 4/2020 | Yamamoto et al. |
| 10,679,578 | B2 | 6/2020 | Tanaka et al. |
| 2003/0041275 | A1 | 2/2003 | Nishio et al. |
| 2008/0054319 | A1 | 3/2008 | Mouli |
| 2008/0093595 | A1 | 4/2008 | Song et al. |
| 2008/0179598 | A1 | 7/2008 | Kim et al. |
| 2008/0283873 | A1 | 11/2008 | Yang et al. |
| 2009/0002590 | A1 | 1/2009 | Kimura |
| 2009/0027371 | A1 | 1/2009 | Lin et al. |
| 2009/0212286 | A1 | 8/2009 | Benzarti |
| 2009/0224330 | A1* | 9/2009 | Hong ............... H10D 84/038 438/455 |
| 2010/0148171 | A1 | 6/2010 | Hayashi et al. |
| 2010/0182223 | A1 | 7/2010 | Choi et al. |
| 2011/0089417 | A1 | 4/2011 | Yamazaki et al. |
| 2011/0101332 | A1 | 5/2011 | Yamazaki et al. |
| 2011/0101334 | A1 | 5/2011 | Yamazaki et al. |
| 2011/0101339 | A1 | 5/2011 | Yamazaki et al. |
| 2011/0101351 | A1 | 5/2011 | Yamazaki |
| 2011/0108836 | A1 | 5/2011 | Koyama et al. |
| 2011/0110145 | A1 | 5/2011 | Yamazaki et al. |
| 2011/0116310 | A1 | 5/2011 | Yamazaki et al. |
| 2011/0121285 | A1 | 5/2011 | Yamazaki et al. |
| 2011/0121286 | A1 | 5/2011 | Yamazaki et al. |
| 2011/0122670 | A1 | 5/2011 | Yamazaki et al. |
| 2011/0122673 | A1 | 5/2011 | Kamata et al. |
| 2011/0128777 | A1 | 6/2011 | Yamazaki et al. |
| 2011/0134683 | A1 | 6/2011 | Yamazaki et al. |
| 2011/0147737 | A1 | 6/2011 | Yamazaki et al. |
| 2011/0194331 | A1 | 8/2011 | Kawae et al. |
| 2013/0256657 | A1 | 10/2013 | Yamazaki et al. |
| 2014/0362324 | A1 | 12/2014 | Yamazaki et al. |
| 2015/0055051 | A1 | 2/2015 | Osawa et al. |
| 2015/0123084 | A1 | 5/2015 | Kim et al. |
| 2016/0056179 | A1 | 2/2016 | Toriumi et al. |
| 2016/0155850 | A1 | 6/2016 | Yamazaki |
| 2016/0163745 | A1 | 6/2016 | Choi et al. |
| 2016/0381266 | A1 | 12/2016 | Ohmaru |
| 2017/0040424 | A1 | 2/2017 | Tanaka et al. |
| 2020/0152800 | A1 | 5/2020 | Zhou et al. |
| 2021/0150999 | A1* | 5/2021 | Sasaki ............... G09G 3/3688 |
| 2023/0125324 | A1 | 4/2023 | Sato et al. |

FOREIGN PATENT DOCUMENTS

| | | | |
|---|---|---|---|
| JP | 2010-277652 A | 12/2010 | |
| JP | 2015-014786 A | 1/2015 | |
| JP | 2016-046527 A | 4/2016 | |
| JP | 2017-212711 A | 11/2017 | |
| KR | 2017-0000342 A | 1/2017 | |
| TW | 201507163 | 2/2015 | |
| WO | WO-2013002192 A1 * | 1/2013 | .......... G09G 3/3648 |
| WO | WO-2014/196550 | 12/2014 | |

OTHER PUBLICATIONS

Written Opinion (Application No. PCT/IB2021/057541) Dated Nov. 22, 2021.

Yonebayashi.R et al., "High Refresh Rate and Low Power Consumption AMOLED Panel Using Top-gate n-Oxide and p-LTPS TFTs", SID Digest '20 : SID International Symposium Digest of Technical Papers, Sep. 25, 2020, pp. 355-358.

* cited by examiner

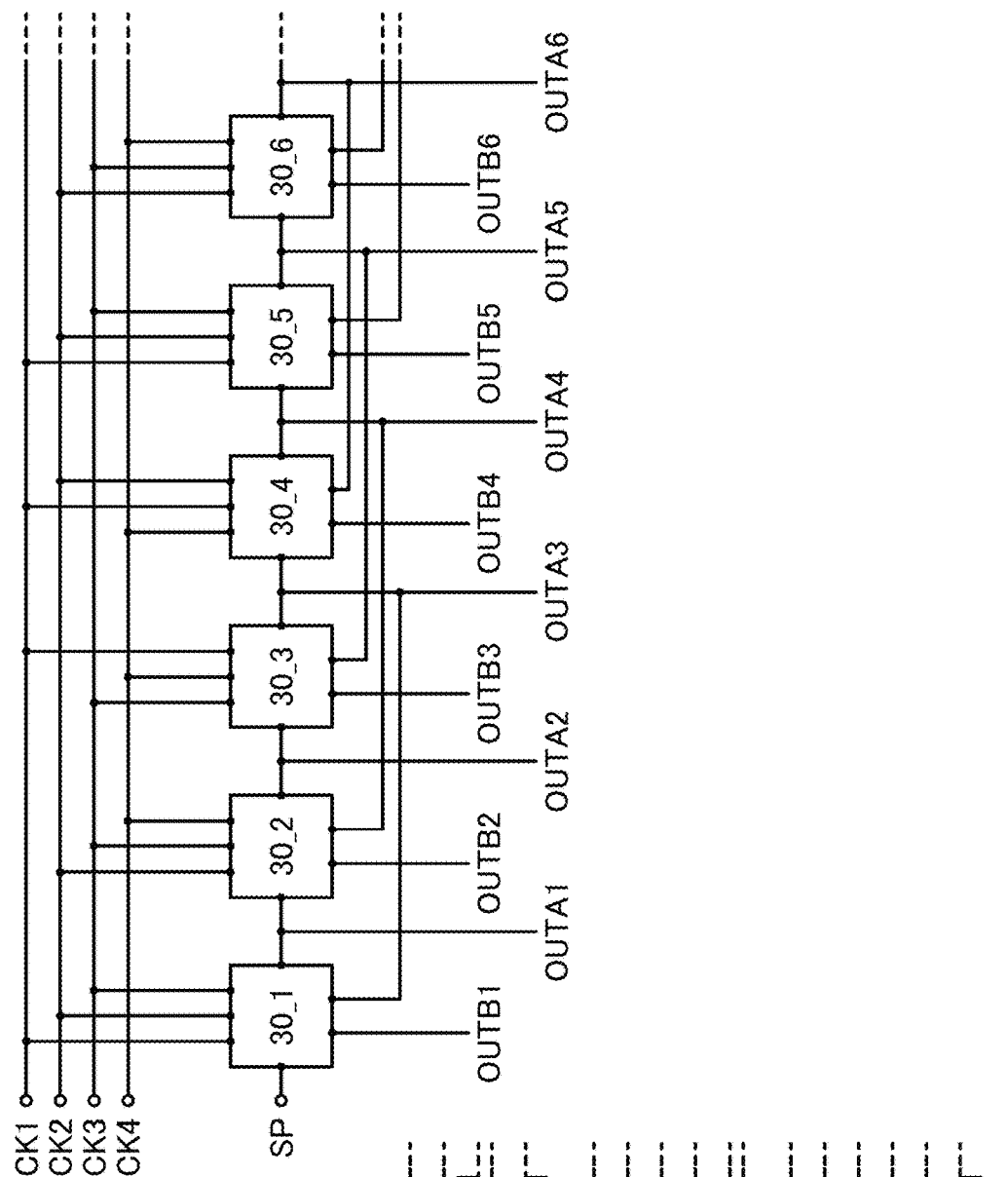
FIG. 7A
FIG. 7B
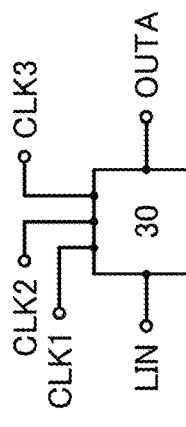
FIG. 7C

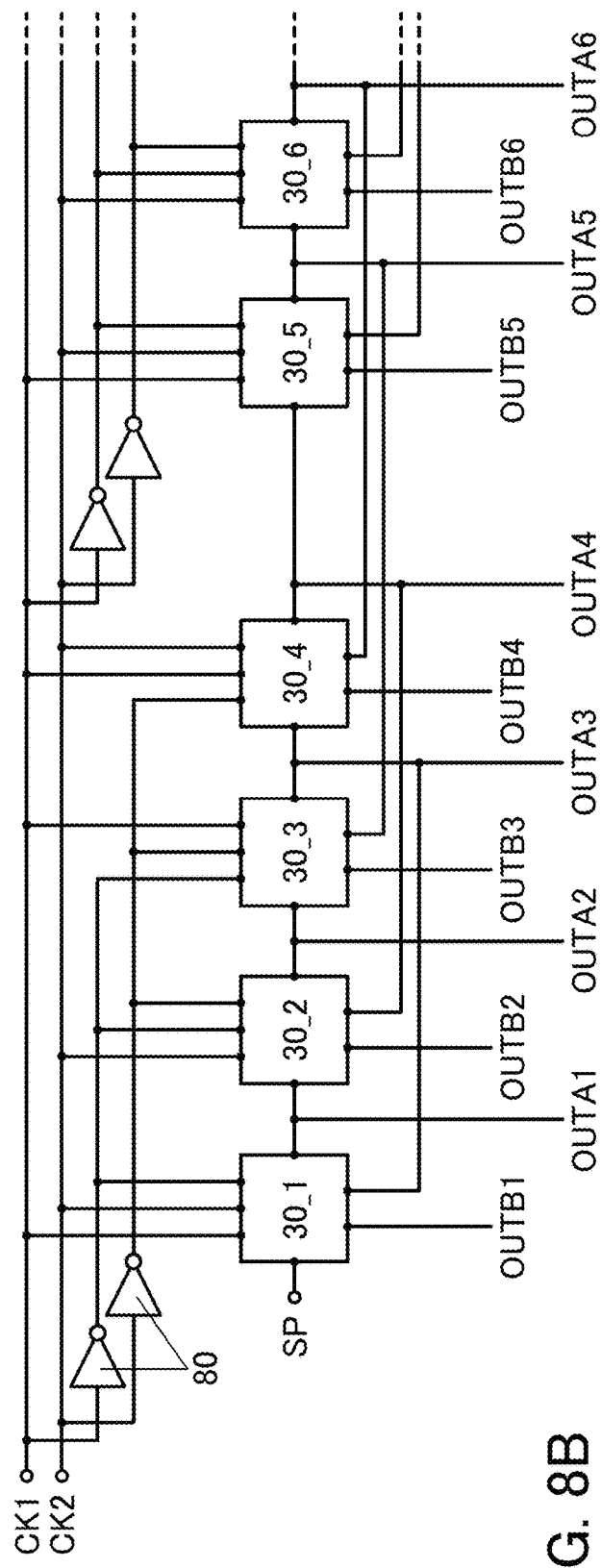
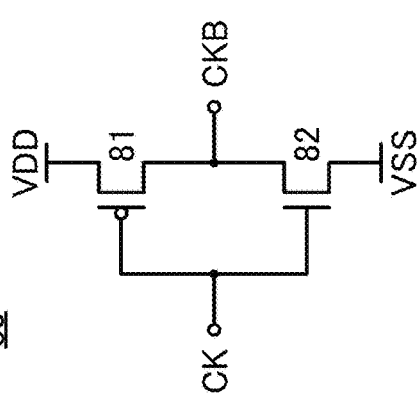

SEMICONDUCTOR DEVICE, DISPLAY DEVICE, AND ELECTRONIC DEVICE

CROSS REFERENCE TO RELATED APPLICATIONS

This application is a continuation of U.S. application Ser. No. 18/022,329, filed Feb. 21, 2023, now pending, which is incorporated by reference and is a U.S. National Phase Application under 35 U.S.C. § 371 of International Application PCT/IB2021/057541, filed on Aug. 17, 2021, which is incorporated by reference and claims the benefit of a foreign priority application filed in Japan on Aug. 27, 2020, as Application No. 2020-143219.

TECHNICAL FIELD

One embodiment of the present invention relates to a semiconductor device. One embodiment of the present invention relates to a display device. One embodiment of the present invention relates to a driver circuit of a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

Display devices are used in various devices such as portable information terminals, including smartphones, and television devices. In recent years, an increase in the screen occupancy rate of the devices that include display devices has been demanded, and in turn, regions other than the display portion in the display devices have been desired to be narrowed (narrowed bezels have been desired). A system-on-panel obtained by forming some of or all driver circuits over the same substrate as a pixel portion is effective in meeting the above need. Patent Document 1 and Patent Document 2 discloses techniques by which inverter circuits, shift register circuits, or the like used in driver circuits of display devices are formed using transistors having a single polarity.

REFERENCE

Patent Document

[Patent Document 1] Japanese Published Patent Application No. 2001-325798
[Patent Document 2] Japanese Published Patent Application No. 2010-277652

SUMMARY OF THE INVENTION

Problems to be Solved by the Invention

An object of one embodiment of the present invention is to provide a highly functional semiconductor device. An object of one embodiment of the present invention is to provide a highly reliable semiconductor device, a highly reliable display device, or a highly reliable electronic device. An object of one embodiment of the present invention is to provide a semiconductor device, a display device, or an electronic device with low power consumption. An object of one embodiment of the present invention is to provide a semiconductor device in which a display device can have a narrow bezel. An object of one embodiment of the present invention is to provide a semiconductor device, a display device, or an electronic device that has a novel structure. An object of one embodiment of the present invention is to at least reduce at least one of problems of the conventional technique.

Note that the description of these objects does not preclude the existence of other objects. Note that one embodiment of the present invention does not have to achieve all the objects. Note that objects other than these can be derived from the description of the specification, the drawings, the claims, and the like.

Means for Solving the Problems

One embodiment of the present invention is a semiconductor device including a first transistor and a second transistor. The first transistor includes a first semiconductor layer, a first gate electrode, a first electrode, and a second electrode. The second transistor includes a second semiconductor layer, a second gate electrode, a third electrode, and a fourth electrode. The first gate electrode and the second gate electrode are electrically connected to each other. The second electrode and the third electrode are electrically connected to each other. Furthermore, the semiconductor device includes a first insulating layer over the first semiconductor layer and a second insulating layer over the first insulating layer. The second semiconductor layer is provided on and in contact with the second insulating layer. The first insulating layer is less likely to diffuse hydrogen than the second insulating layer. The second insulating layer contains an oxide, the first semiconductor layer contains polycrystalline silicon, and the second semiconductor layer contains a metal oxide. The first transistor is a p-type transistor, and the second transistor is an n-type transistor.

In the above, it is preferable that a first potential be supplied to the first electrode, and a second potential lower than the first potential be supplied to the fourth electrode.

Another embodiment of the present invention is a semiconductor device including a control circuit, a first transistor, and a second transistor. The control circuit includes a first wiring and a second wiring. A plurality of signals are supplied to the control circuit, and the control circuit has a function of controlling potentials inverted from each other to be supplied to the first wiring and the second wiring on the basis of the plurality of signals. The first transistor includes a first semiconductor layer, a first gate electrode, a first electrode, and a second electrode. The second transistor includes a second semiconductor layer, a second gate electrode, a third electrode, and a fourth electrode. The first gate electrode and the second gate electrode are electrically connected to each other. The second electrode and the third electrode are electrically connected to each other. The first gate electrode and the second gate electrode are electrically connected to the first wiring. Furthermore, the semiconductor device includes a first insulating layer over the first semiconductor layer and a second insulating layer over the first insulating layer. The second semiconductor layer is provided on and in contact with the second insulating layer. The first insulating layer is less likely to diffuse hydrogen than the second insulating layer. The second insulating layer contains an oxide, the first semiconductor layer contains polycrystalline silicon, and the second semiconductor layer contains a metal oxide. The first transistor is a p-type transistor, and the second transistor is an n-type transistor.

In the above, it is preferable that a first potential be supplied to the first electrode, and a second potential lower than the first potential be supplied to the fourth electrode. Furthermore, one of the first potential and the second potential is preferably supplied to the second electrode in accordance with the potential of the first wiring.

In any of the above, an amplifier circuit is preferably further included. Here, it is preferable that the amplifier circuit be electrically connected to the first wiring and the second wiring, and include a first output terminal. The amplifier circuit preferably has a function of outputting a potential synchronized with the potential of the first wiring to the first output terminal. The potential of the first output terminal and the potential of the second electrode are preferably inverted potentials of each other.

In the above, the amplifier circuit preferably includes a third transistor, a fourth transistor, and a fifth transistor. It is also preferable that the third transistor be a p-channel transistor, and the fourth transistor and the fifth transistor be n-channel transistors. It is preferable that gates of the third transistor and the fifth transistor be electrically connected to the second wiring; a gate of the fourth transistor be electrically connected to the first wiring; one of a source and a drain of the third transistor, one of a source and a drain of the fourth transistor, and one of a source and a drain of the fifth transistor be electrically connected to the first output terminal; and the other of the source and the drain of the third transistor and the other of the source and the drain of the fourth transistor be electrically connected to each other.

Another embodiment of the present invention is a display device including any of the above semiconductor devices and a pixel. Here, the pixel preferably includes a display element and a sixth transistor. Furthermore, the sixth transistor is preferably provided over the same surface as the first transistor or the second transistor. Moreover, the display element is preferably a liquid crystal element, an organic EL element, or a light-emitting diode.

Another embodiment of the present invention is an electronic device including any of the above display devices and at least one of an antenna, a battery, a housing, a camera, a speaker, a microphone, and an operation button.

Effect of the Invention

According to one embodiment of the present invention, a highly functional semiconductor device can be provided. According to one embodiment of the present invention, a highly reliable semiconductor device, a highly reliable display device, or a highly reliable electronic device can be provided. According to one embodiment of the present invention, a semiconductor device, a display device, or an electronic device with low power consumption can be provided. According to one embodiment of the present invention, a semiconductor device in which a display device can have a narrow bezel can be provided. According to one embodiment of the present invention, a semiconductor device, a display device, or an electronic device that has a novel structure can be provided. According to one embodiment of the present invention, at least one of problems of the conventional technique can be reduced.

Note that the description of these effects does not preclude the existence of other effects. Note that one embodiment of the present invention does not need to have all the effects. Note that effects other than these can be derived from the description of the specification, the drawings, the claims, and the like.

BRIEF DESCRIPTION OF THE DRAWINGS

FIG. 7A is a diagram illustrating a structure example of a sequence circuit. FIG. 7B is a circuit diagram of a shift register. FIG. 7C is a timing chart.

FIG. 8A is a circuit diagram of a shift register. FIG. 8B is a circuit diagram of an inverter circuit.

MODE FOR CARRYING OUT THE INVENTION

Figure 1A:
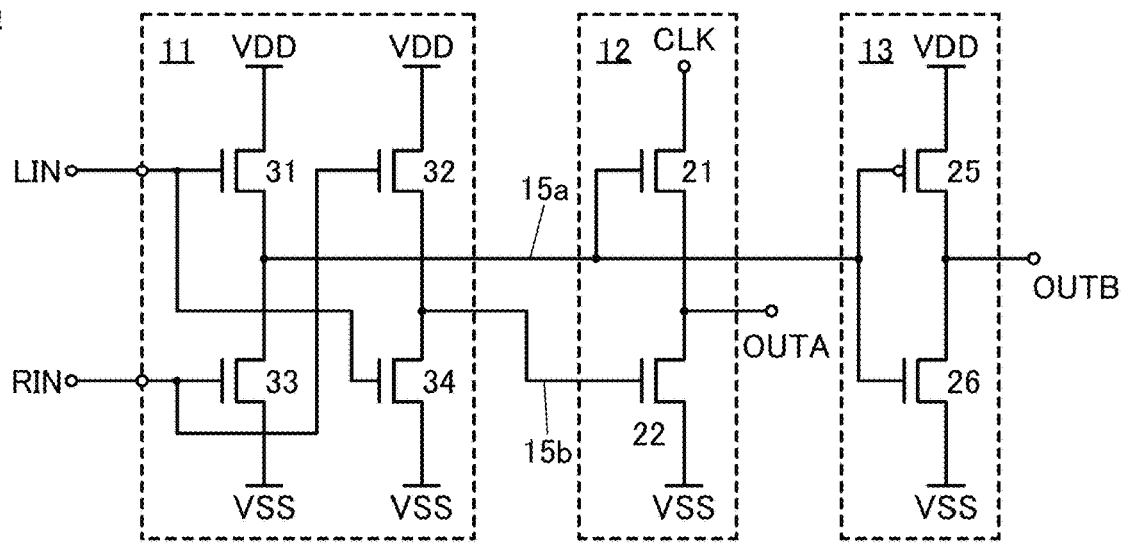
FIG. 1A is a diagram illustrating a structure example of a sequence circuit.

Embodiments will be described below with reference to the drawings. Note that the embodiments can be implemented with many different modes, and it is readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not necessarily limited to the illustrated scale.

Note that in this specification and the like, the ordinal numbers such as "first" and "second" are used in order to avoid confusion among components and do not limit the number.

A transistor is a kind of semiconductor elements and can achieve amplification of current or voltage, switching operation for controlling conduction or non-conduction, and the like. An IGFET (Insulated Gate Field Effect Transistor), a thin film transistor (TFT), and the like are in the category of a transistor in this specification.

Functions of a "source" and a "drain" are sometimes replaced with each other when a transistor of opposite polarity is used or when the direction of current is changed in circuit operation, for example. Therefore, the terms "source" and "drain" can be switched in this specification.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric function" include a switching element such as a transistor, a resistor, a coil, a capacitor, and other elements with a variety of functions as well as an electrode and a wiring.

Note that in this specification and the like, a node is an element (e.g., a wiring and the like) that enables electrical connection between elements included in a circuit. Thus, a "node to which A is connected" is a wiring that is electrically connected to A and can be regarded as having the same potential as A. Note that even when one or more elements which enable electrical connection (e.g., switches, transistors, capacitive elements, inductors, resistors, diodes, and the like) are inserted in a portion of the wiring, the wiring can be regarded as the node to which A is connected as long as it has the same potential as A.

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, structure examples of a semiconductor device of one embodiment of the present invention are described.

Structure Example 1

FIG. 1A illustrates a structure example of a sequential circuit 10 of one embodiment of the present invention. The sequential circuit 10 includes a circuit 11, a circuit 12, and a circuit 13. The circuit 11 includes a wiring 15a and a wiring 15b. The circuit 11 and the circuit 12 are electrically connected to each other through the wiring 15a and the wiring 15b. The circuit 11 and the circuit 13 are electrically connected to each other through the wiring 15a.

The circuit 11 has a function of outputting a first signal to the wiring 15a and outputting a second signal to the wiring 15b in accordance with the potentials of a signal LIN and a signal RIN. That is, the circuit 11 can also be referred to as a control circuit.

The second signal is a signal obtained by inverting the first signal. That is, in the case where the first signal and the second signal are each a signal having two kinds of potentials, a high potential and a low potential, the circuit 11 outputs a low potential to the wiring 15b when outputting a high potential to the wiring 15a, and the circuit 11 outputs a high potential to the wiring 15b when outputting a low potential to the wiring 15a.

The circuit 12 has a function of outputting one of a signal CLK and a potential VSS to an output terminal OUTA on the basis of the signals input to the wiring 15a and the wiring 15b. The circuit 12 outputs the signal CLK when the wiring 15a is at a high potential and outputs the potential VSS when the wiring 15a is at a low potential. The circuit 12 can be referred to as an amplifier circuit, a buffer circuit, or the like.

As the signal CLK, a clock signal can be used. As the clock signal, a signal with a duty ratio (a percentage of a period of a high-level potential to one cycle of a signal) higher than or equal to 45% and lower than or equal to 55% can be suitably used. As the clock signal, a signal with a duty ratio of 50% is further preferably used. Note that the duty ratio of the clock signal is not limited to the above and can be changed as appropriate in accordance with a driving method.

Note that in this specification and the like, a clock signal refers to a signal in which a high potential and a low potential are alternated and an interval between a potential rise and a next potential rise or an interval between a potential fall and a next potential fall is constant. In this specification and the like, a pulse signal refers to a signal whose potential changes over time. A pulse signal includes a signal whose potential changes periodically. For example, a pulse signal includes signals whose potentials change periodically, such as a rectangular wave, a triangular wave, a sawtooth wave, and a sine wave. Thus, a clock signal can be regarded as one embodiment of a pulse signal.

Here, a potential VDD can be a potential higher than the potential VSS. The signal CLK is a signal in which a high potential and a low potential are alternated. At this time, the low potential of the signal CLK is preferably the same potential as the potential VSS. Instead of the signal CLK, a high potential (e.g., the potential VDD) may be supplied to one of a source and a drain of a transistor 21.

The circuit 13 has a function of outputting one of the potential VDD and the potential VSS to an output terminal OUTB in accordance with the potential of the wiring 15a. The circuit 13 outputs the potential VSS that is a low potential when the wiring 15a is at a high potential and outputs the potential VDD that is a high potential when the wiring 15a is at a low potential. That is, the circuit 13 can output a signal obtained by inverting the first signal to the output terminal OUTB. In other words, the circuit 13 can output a signal similar to the second signal to the output terminal OUTB. The circuit 13 can be referred to as an inverter circuit or the like.

The sequential circuit 10 functions as a flip-flop circuit and can be used as part of a shift register circuit. For example, the sequential circuit 10 can be used as part of a driver circuit of a display device. In particular, the sequential circuit 10 can be suitably used as part of a scan line driver circuit (also referred to as a gate driver circuit) of a display device.

In the case where the sequential circuit 10 is used as a scan line driver circuit, a scanning line (also referred to as a gate line) connected to a plurality of pixels of a display device can be connected to at least one or both of the output terminal OUTA and the output terminal OUTB. When a scanning line is connected to each of the output terminal OUTA and the output terminal OUTB, a pixel can be driven with two kinds of scanning line signals, so that a pixel can have more functions.

The circuit 11 includes a transistor 31 to a transistor 34. N-channel transistors are preferably used as the transistor 31 to the transistor 34.

The conduction or the non-conduction of each of the transistor 31 and the transistor 34 is selected in accordance with the potential of the signal LIN. The conduction or the non-conduction of each of the transistor 32 and the transistor 33 is selected in accordance with the potential of the signal RIN.

When the signal LIN is a high potential and the signal RIN is a low potential, the transistor 31 is turned on and the transistor 33 is turned off, so that a wiring to which the potential VDD is supplied and the wiring 15*a* are electrically connected to each other. Furthermore, the transistor 34 is turned on and the transistor 32 is turned off, so that a wiring to which the potential VSS is supplied and the wiring 15*b* are electrically connected to each other. Meanwhile, when the signal LIN is at a low potential and the signal RIN is at a high potential, the on state and the off state of each transistor are reversed, so that the wiring 15*a* is electrically connected to the wiring to which the potential VSS is supplied, and the wiring 15*b* is electrically connected to the wiring to which the potential VDD is supplied.

The circuit 12 includes the transistor 21 and a transistor 22. N-channel transistors are preferably used as the transistor 21 and the transistor 22.

In the transistor 21 of the circuit 12, a gate is electrically connected to the wiring 15*a*, one of a source and a drain is electrically connected to a wiring to which the signal CLK is supplied, and the other thereof is electrically connected to one of a source and a drain of the transistor 22 and the output terminal OUTA. A gate of the transistor 22 is electrically connected to the wiring 15*b*, and the other of the source and the drain of the transistor 22 is electrically connected to the wiring to which the potential VSS is supplied. Note that the output terminal OUTA is a portion to which an output potential from the circuit 12 is supplied and may be part of a wiring or part of an electrode.

In the circuit 12, when the wiring 15*a* is at a high potential and the wiring 15*b* is at a low potential, the signal CLK is output to the output terminal OUTA through the transistor 21. By contrast, when the wiring 15*a* is at a low potential and the wiring 15*b* is at a high potential, the potential VSS is output to the output terminal OUTA through the transistor 22.

The circuit 13 includes a transistor 25 and a transistor 26. The transistor 25 is preferably a p-channel transistor (p-type transistor), and the transistor 26 is preferably an n-channel transistor (n-type transistor).

In the transistor 25 of the circuit 13, a gate is electrically connected to the wiring 15*a*, one of a source and a drain is electrically connected to the wiring to which the potential VDD is supplied, and the other thereof is electrically connected to one of a source and drain of the transistor 26 and the output terminal OUTB. A gate of the transistor 26 is electrically connected to the wiring 15*a*, and the other of the source and the drain of the transistor 26 is electrically connected to the wiring to which the potential VSS is supplied. Note that the output terminal OUTB is a portion to which an output potential from the circuit 13 is supplied and may be part of a wiring or part of an electrode.

In the circuit 13, when the wiring 15*a* is at a high potential, the potential VSS is output to the output terminal OUTB through the transistor 26. By contrast, when the wiring 15*a* is at a low potential, the potential VDD is output to the output terminal OUTB through the transistor 25.

Figure 1B:
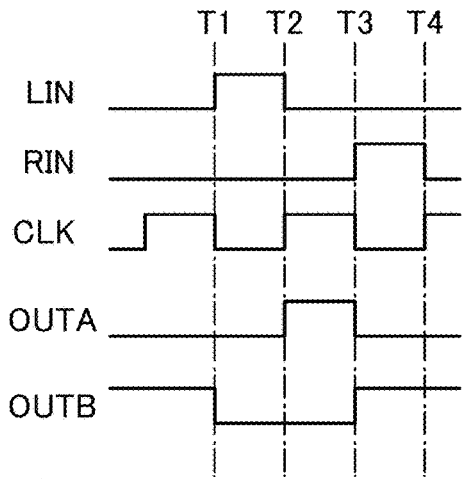
FIG. 1B is a timing chart of the sequential circuit.

FIG. 1B is a timing chart showing an example of a driving method for the sequential circuit 10. FIG. 1B schematically shows potential changes over time in the signal LIN, the signal RIN, the signal CLK, the output terminal OUTA, and the output terminal OUTB.

Before Time T1, both the signal LIN and the signal RIN are at low potentials. Before Time T1, a low potential is output to the output terminal OUTA and a high potential is output to the output terminal OUTB regardless of the potential of the signal CLK.

At Time T1, the signal LIN becomes a high potential. In Period T1-T2, the signal CLK is at a low potential. Accordingly, in Period T1-T2, the signal CLK (i.e., a low potential) is output to the output terminal OUTA, and a low potential is output to the output terminal OUTB.

Then, at Time T2, the signal LIN becomes a low potential. Thus, all of the four transistors in the circuit 11 are turned off, whereby the potentials of the wiring 15*a* and the wiring 15*b* are retained. The signal CLK changes to a high potential at Time T2. Accordingly, in Period T2-T3, a high potential is output to the output terminal OUTA, and the low potential is continuously output to the output terminal OUTB.

Then, at Time T3, the signal RIN becomes a high potential. Thus, the wiring 15*a* becomes a low potential, and the wiring 15*b* becomes a high potential. Accordingly, in Period T3-T4, a low potential is supplied to the output terminal OUTA, and a high potential is supplied to the output terminal OUTB.

At Time T4, the signal RIN becomes a low potential. Thus, all of the transistors in the circuit 11 are turned off, and the potentials of the wiring 15*a* and the wiring 15*b* are retained. Accordingly, after Time T4, the low potential is output to the output terminal OUTA, and the high potential is output to the output terminal OUTB.

Before Time T1 and after Time T4 can be referred to as periods in which the sequential circuit 10 is in a standby state (also referred to as a non-operative state or a non-selected state) since both the signal LIN and the signal RIN are at low potentials. In the periods, a low potential is output to the output terminal OUTA, and a high potential is output to the output terminal OUTB.

As shown in FIG. 1B, the signal output to the output terminal OUTA is a signal that becomes a high potential only in Period T2-T3 and always becomes a low potential in other periods. That is, the signal output to the output terminal OUTA of the sequential circuit 10 can be referred to as a normally low signal. Meanwhile, the signal output to the output terminal OUTB is a signal that becomes a low potential only in Period T1-T3 and always becomes a high potential in other periods. That is, the signal output to the output terminal OUTB can be referred to as a normally high signal. Accordingly, the sequential circuit 10 can output two kinds of signals, a normally low signal and a normally high signal, so that when the sequential circuit 10 is used as a scan line driver circuit of a display device, for example, a pixel of the display device can be driven by the two kinds of signals. Thus, a multifunctional display device can be achieved.

The above is the description of the operation method example of the sequential circuit 10.

Here, as an n-channel transistor included in the sequential circuit 10, a transistor in which an oxide semiconductor is used in a semiconductor layer where a channel is formed is preferably used. Such a transistor has leakage current flowing between a source and the drain in an off state much lower than that of a transistor including silicon. When such a transistor is used in the circuit 11, the circuit 12, and the circuit 13, the power consumption of each circuit can be extremely low.

As a p-channel transistor included in the sequential circuit 10, a transistor in which silicon is used in a semiconductor layer where a channel is formed is preferably used. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) is preferably used. The LTPS transistor has high field-effect mobility and favorable frequency characteristics. Since the LTPS transistor has a large amount of current that can flow in an on state, the time taken for charging and discharging a wiring connected to the output terminal OUTB can be shortened. Thus, in particular, the n-channel transistor 26 and the p-channel transistor 25 are used to form a CMOS (Complementary Metal Oxide Semiconductor) in the circuit 13, whereby the circuit 13 with high driving capability and low power consumption can be achieved.

Figure 1C:
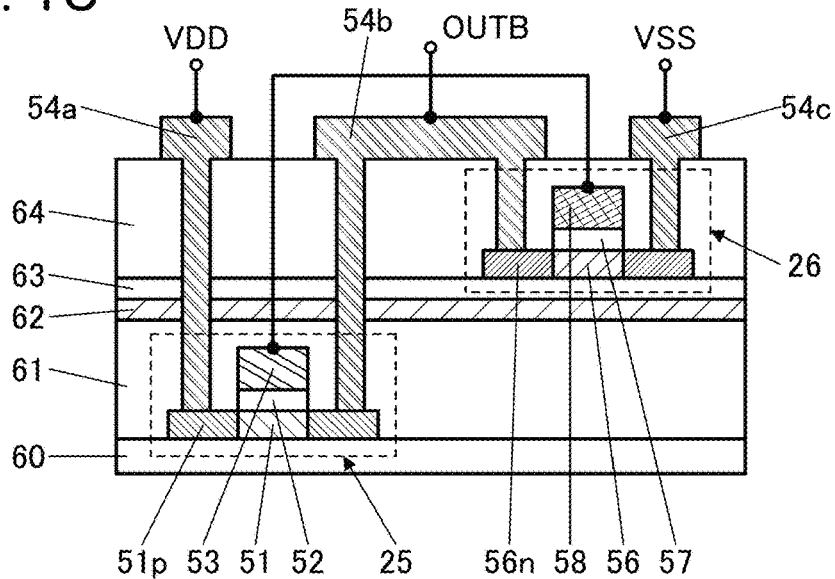
FIG. 1C is a schematic cross-sectional view of the sequential circuit.

A p-channel transistor and an n-channel transistor that can be used in the sequential circuit 10 are preferably formed over the same substrate. A stacked-layer structure of the sequential circuit 10 is described below. For example, FIG. 1C illustrates a schematic cross-sectional view of the sequential circuit 10 including cross sections of the transistor 25 and the transistor 26 included in the circuit 13 in the channel length direction.

The transistor 25 and the transistor 26 are provided over the insulating layer 60. As the transistor 25 and the transistor 26, FIG. 1C illustrates an example in which each transistor is what is called a top-gate transistor, in which the gate electrode is provided over the semiconductor layer. Note that the structure of the transistor is not limited to this.

The transistor 25 includes a semiconductor layer 51, a gate insulating layer 52, and a gate electrode 53. The semiconductor layer 51 contains polycrystalline silicon. The semiconductor layer 51 includes a pair of low-resistance regions 51*p* exhibiting p-type conductivity with a channel formation region therebetween. The transistor 26 includes a semiconductor layer 56, a gate insulating layer 57, and a gate electrode 58. The semiconductor layer 56 contains a metal oxide. The semiconductor layer 56 includes a pair of low-resistance regions 56*n* exhibiting n-type conductivity with a channel formation region therebetween.

The semiconductor layer 51 of the transistor 25 is provided over the insulating layer 60. An insulating layer 61 is provided to cover the transistor 25, and an insulating layer 62 and an insulating layer 63 are stacked over the insulating layer 61. The semiconductor layer 56 of the transistor 26 is provided in contact with a top surface of the insulating layer 63. The insulating layer 64 is provided to cover the transistor 26.

A conductive layer 54*a*, a conductive layer 54*b*, and a conductive layer 54*c* are provided over the insulating layer 64. Part of the conductive layer 54*a* corresponds to the wiring to which the potential VDD is supplied. Part of the conductive layer 54*c* corresponds to the wiring to which the potential VSS is supplied. Part of the conductive layer 54*b* corresponds to the output terminal OUTB. The gate electrode 53 and the gate electrode 58 are electrically connected to each other in a region not illustrated.

The conductive layer 54*a* and the conductive layer 54*b* are electrically connected to the low-resistance region 51*p* in opening portions provided in the insulating layer 64, the insulating layer 63, the insulating layer 62, and the insulating layer 61. The conductive layer 54*b* and the conductive layer 54*c* are electrically connected to the low-resistance region 56*n* in opening portions provided in the insulating layer 64.

Here, since the polycrystalline silicon improves the reliability by terminating a dangling bond of silicon with a hydrogen atom, so that the semiconductor layer 51 and its vicinity (e.g., the insulating layer 61) can contain a hydrogen atom, hydrogen molecule, or a compound containing hydrogen (e.g., water) contained in the formation process. By contrast, in an oxide semiconductor, since hydrogen is an element that can serve as a carrier supply source, the hydrogen concentrations in the semiconductor layer 56 of the transistor 26 and its vicinity are preferably reduced as much as possible. Furthermore, in the oxide semiconductor, since oxygen vacancy can also be a cause of a carrier supply source, an oxide with reduced hydrogen is preferably provided in contact with the semiconductor layer 56 of the transistor 26.

Thus, it is preferable that the semiconductor layer 51 of the transistor 25 and the semiconductor layer 56 of the transistor 26 be isolated from each other by the insulating layer 62 having a barrier property against hydrogen and water. In addition, the semiconductor layer 56 of the transistor 26 is preferably provided on and in contact with the insulating layer 63 containing oxide. In this case, the insulating layer 62 contains a material having a lower permeability of hydrogen and water than at least the insulating layer 61 and the insulating layer 63 (a material through which hydrogen and water do not easily transmit).

More specifically, as the insulating layer 62, an inorganic insulating film containing silicon nitride, silicon nitride oxide, aluminum oxide, or hafnium oxide can be used. An oxide film of silicon oxide, silicon oxynitride, or the like can be used as the insulating layer 63. In that case, the insulating layer 63 is preferably a film from which oxygen is released by heating.

When the two kinds of transistors included in the sequential circuit 10 have a structure described here, a sequential circuit with high driving capability, low power consumption, and high reliability can be obtained.

The above is the description of the stacked-layer structure.

Structure Example 2

Sequential circuits having structures different from those in Structure example 1 above are described below.

Structure Example 2-1

Figure 2A:
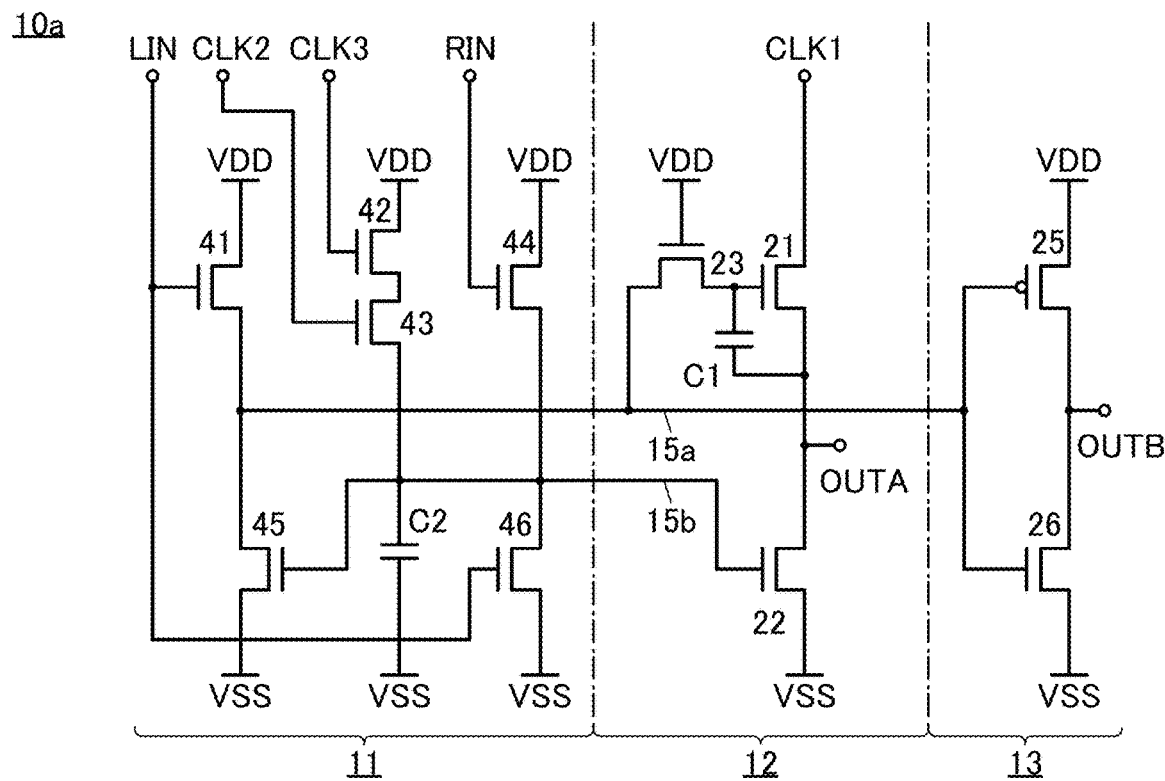
FIG. 2A and FIG. 2B are diagrams illustrating structure examples of a sequence circuit.

FIG. 2A illustrates a structure example of a sequential circuit 10*a*. The sequential circuit 10*a* is different from the sequential circuit 10 mainly in the structures of the circuit 11 and the circuit 12. The circuit 13 has a structure similar to the sequential circuit 10; thus, the description thereof is omitted.

The circuit 11 includes a transistor 41 to a transistor 46 and a capacitor C2. To the circuit 11, the signal LIN, a signal CLK2, a signal CLK3, and the signal RIN are input.

The circuit 12 includes the transistor 21, the transistor 22, a transistor 23, and a capacitor C1. A signal CLK1 is input to the circuit 12.

The circuit 11 and the circuit 13 are supplied with the potential VDD that is a high potential and the potential VSS that is a low potential.

The above-described n-channel transistor is preferably used as the transistor 41 to the transistor 46 and the transistor 21 to the transistor 23. In particular, a transistor using an oxide semiconductor as a semiconductor where a channel is formed is preferably used.

The circuit 11 has a function of outputting the first signal and the second signal obtained by inverting the first signal respectively to the wiring 15a and the wiring 15b in accordance with a variety of signals input.

Specifically, in the transistor 41, a gate is electrically connected to a wiring to which the signal LIN is supplied, one of a source and a drain is electrically connected to the wiring 15a and one of a source and a drain of the transistor 45, and the other thereof is electrically connected to the wiring to which the potential VDD is supplied. In the transistor 42, a gate is electrically connected to a wiring to which the signal CLK3 is supplied, one of a source and a drain is electrically connected to one of a source and a drain of the transistor 43, and the other thereof is electrically connected to the wiring to which the potential VDD is supplied. In the transistor 43, a gate is electrically connected to a wiring to which the signal CLK2 is supplied, and the other of the source and the drain is electrically connected to the wiring 15b, one electrode of the capacitor C2, and a gate of the transistor 45. In the transistor 44, a gate is electrically connected to a wiring to which the signal RIN is supplied, one of a source and a drain is electrically connected to the wiring 15b, and the other thereof is electrically connected to the wiring to which the potential VDD is supplied. In the transistor 45, the other of the source and the drain is electrically connected to the wiring to which the potential VSS is supplied. In the transistor 46, a gate is electrically connected to the wiring to which the signal LIN is supplied, one of a source and a drain is electrically connected to the wiring 15b, and the other thereof is electrically connected to the wiring to which the potential VSS is supplied. The other electrode of the capacitor C2 is electrically connected to the wiring to which the potential VSS is supplied.

The circuit 12 included in the sequential circuit 10a has a structure in which the transistor 23 and the capacitor C1 are added to the structure illustrated in FIG. 1A.

In the transistor 23, a gate is electrically connected to the wiring to which the potential VDD is supplied, one of a source and a drain is electrically connected to the wiring 15a, and the other thereof is electrically connected to the gate of the transistor 21. One electrode of the capacitor C1 is electrically connected to the gate of the transistor 21, and the other electrode thereof is electrically connected to the other of the source and the drain of the transistor 21. One of the source and the drain of the transistor 21 is electrically connected to a wiring to which the signal CLK1 is supplied.

When a high potential is supplied to the wiring 15a, the high potential is supplied to the gate of the transistor 21 through the transistor 23 and thus the transistor 21 is turned on. At this time, in the case where the high potential supplied to the wiring 15a is equal to the potential VDD, a potential that is lower than the potential VDD by the threshold voltage of the transistor 23 is supplied to the gate of the transistor 21.

Since the output terminal OUTA and the gate of the transistor 21 are electrically connected to each other through the capacitor C1, the potential of the output terminal OUTA increases owning to a bootstrap effect. Then, the potential of the gate of the transistor 21 (the potential of the other of the source and the drain of the transistor 23) increases. For example, the potential of the gate of the transistor 21 increases to a potential close to twice as high as the potential VDD; thus, the potential VDD can be output to the output terminal OUTA without being affected by the threshold voltage of the transistor 21. Accordingly, the sequential circuit 10a with high output performance can be obtained without an increase in the kinds of power supply potentials.

After that, the transistor 23 is turned off when the potential of the other of the source and the drain of the transistor 23 exceeds the potential VDD; thus, the gate of the transistor 21 and the wiring 15a are electrically separated from each other and the gate of the transistor 22 is brought into a floating state. When the transistor 23 is turned off, the potential of the wiring 15a does not increase from the output potential of the circuit 12; thus, application of a potential higher than the output potential to the transistors or the like in the circuit 12 through the wiring 15a can be prevented. As a result, the reliability of the sequence circuit 10a can be increased.

Structure Example 2-2

Figure 2B:
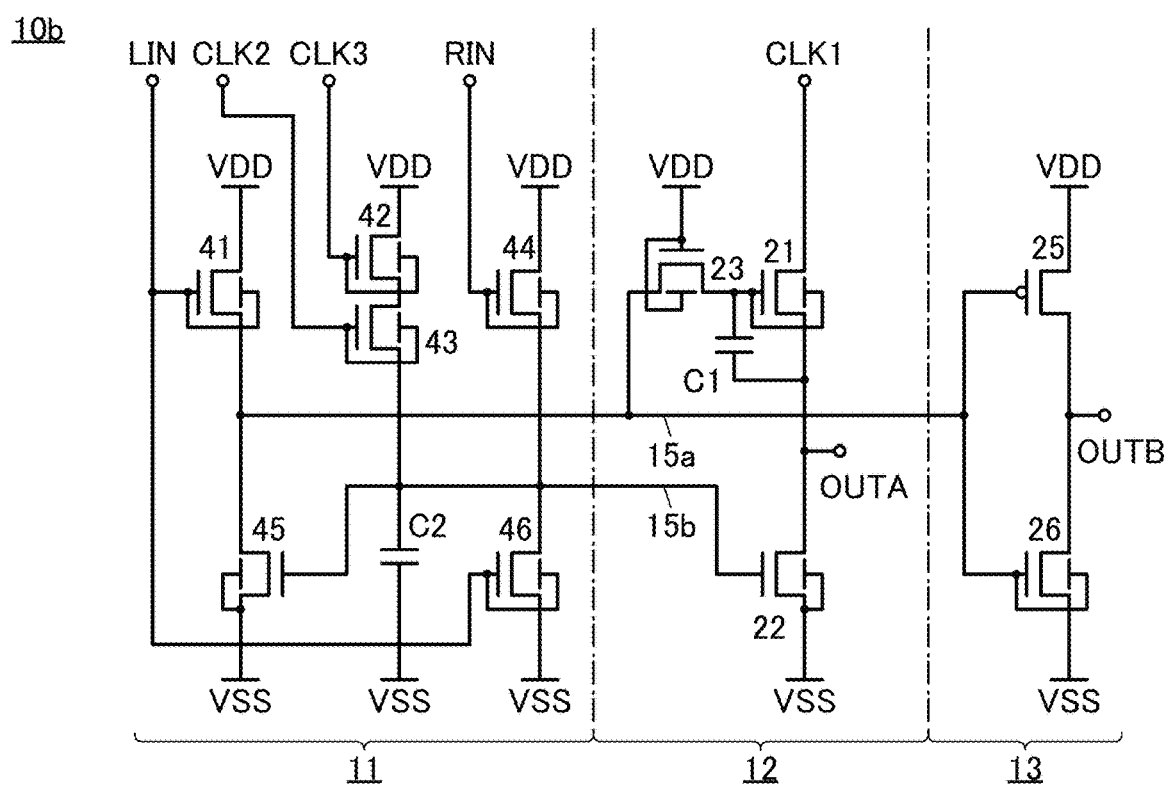

FIG. 2B illustrates a structure example of a sequential circuit 10b. The sequential circuit 10b is different from the sequential circuit 10a in the structure of the transistor.

In the sequential circuit 10b, transistors each including a back gate are used as n-channel transistors included in the circuit 11, the circuit 12, and the circuit 13.

Back gates of the transistor 45 and the transistor 22 are electrically connected to the wiring to which the potential VSS is supplied. That is, the transistor 45 and the transistor 22 each have a structure in which the back gate is electrically connected to the source.

Here, in the case where the sequential circuit 10b is used as a scan line driver circuit, a period during which the wiring 15b is at a high potential is significantly longer than a period during which it is a low potential. Thus, a period during which the transistor 45 and transistor 22 whose gates are connected to the wiring 15b are in an on state is significantly longer than a period during which they are in an off state. Thus, the threshold voltages of the transistor 45 and the transistor 22 are more likely to change than those of the other transistors. Specifically, the threshold voltages of the transistors are easily shifted in a positive direction.

Thus, in each of the transistor 45 and the transistor 22, one of a pair of gates overlapping with each other with a semiconductor layer therebetween is electrically connected to a wiring to which a low potential is supplied (the wiring to which the potential VSS is supplied). Such a structure can suitably inhibit the shift of the threshold voltages of the transistor 45 and the transistor 22 in the positive direction. Thus, the reliability of the sequential circuit 10b can be increased, leading to an increase in the reliability of a semiconductor device, a display device, an electronic device, and the like each including the sequential circuit 10b.

The structure in which the one of the gates is electrically connected to the source can also suitably prevent the transistor 45 and the transistor 22 from having a negative threshold voltage value. That is, the transistor 45 and the transistor 22 can easily have normally-off characteristics.

Moreover, by having the structure in which the one of the gates and the source are electrically connected to each other, the transistor 45 and the transistor 22 also have an effect of increasing saturation. This facilitates designing of the circuit 11 and the circuit 12 and enables the circuit 11 and the circuit 12 to operate stably.

Meanwhile, transistors in which a pair of gates are electrically connected to each other are used as n-channel transistors other than the transistor 45 and the transistor 22. When the pair of gates overlapping with each other with a semiconductor layer therebetween, the on-state currents of the transistors can be increased. Accordingly, the driving capability of the sequential circuit 10b can be improved.

Structure Example 2-3

In the sequential circuit 10a, the wiring 15b is supplied with a potential obtained by inverting the potential of the wiring 15a. By contrast, the circuit 13 can output the signal obtained by inverting the potential of the wiring 15a to the output terminal OUTB. Thus, when the output potential of the output terminal OUTB is supplied (fed back) to the wiring 15b, the structure of the circuit 11 can be simplified.

Figure 3A:
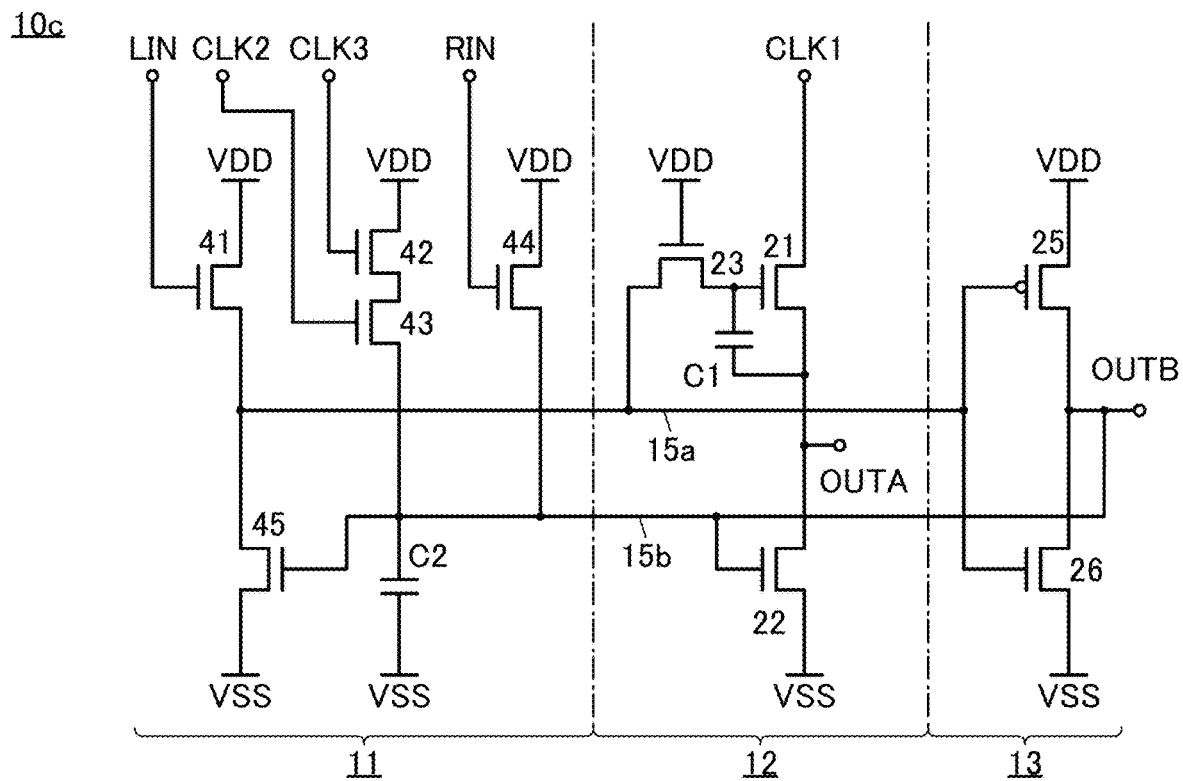
FIG. 3A and FIG. 3B are diagrams illustrating structure examples of a sequence circuit.

FIG. 3A illustrates a structure example of a sequential circuit 10c.

The sequential circuit 10c is different from the sequential circuit 10a mainly in the structure of the circuit 11. Specifically, in the sequential circuit 10c, the wiring 15b and the output terminal OUTB of the circuit 13 are electrically connected to each other. Furthermore, in the sequential circuit 10c, the transistor 46 functioning as a switch for controlling electrical continuity and discontinuity between the wiring 15b and the potential VSS is omitted from the sequential circuit 10a.

Figure 3B:
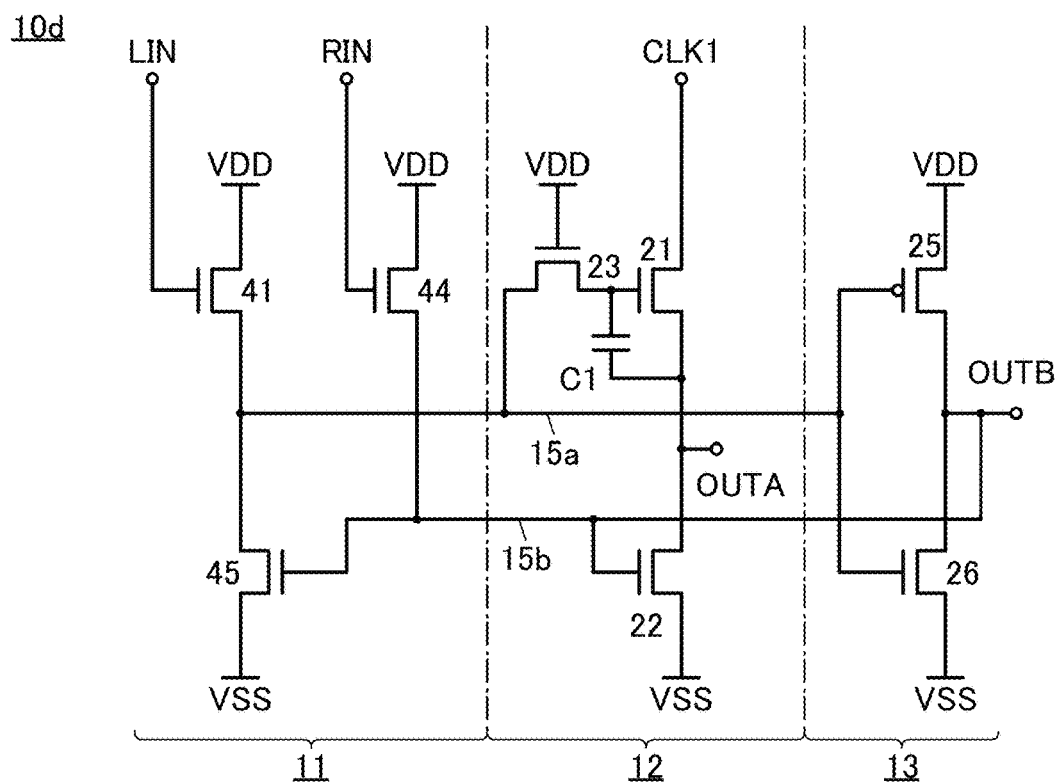

FIG. 3B illustrates a structure example of a sequential circuit 10d.

In the sequential circuit 10d, the transistor 42, the transistor 43, and the capacitor C2 are further omitted from the sequential circuit 10c. That is, the circuit 11 is formed using the transistor 41, the transistor 44, and the transistor 45.

Note that without limitation to the above, the circuit 11 can have a structure in which one or more of the transistor 42, the transistor 43, the transistor 44, and the transistor 46 are omitted from the sequential circuit 10a.

Structure Example 2-4

Figure 4:
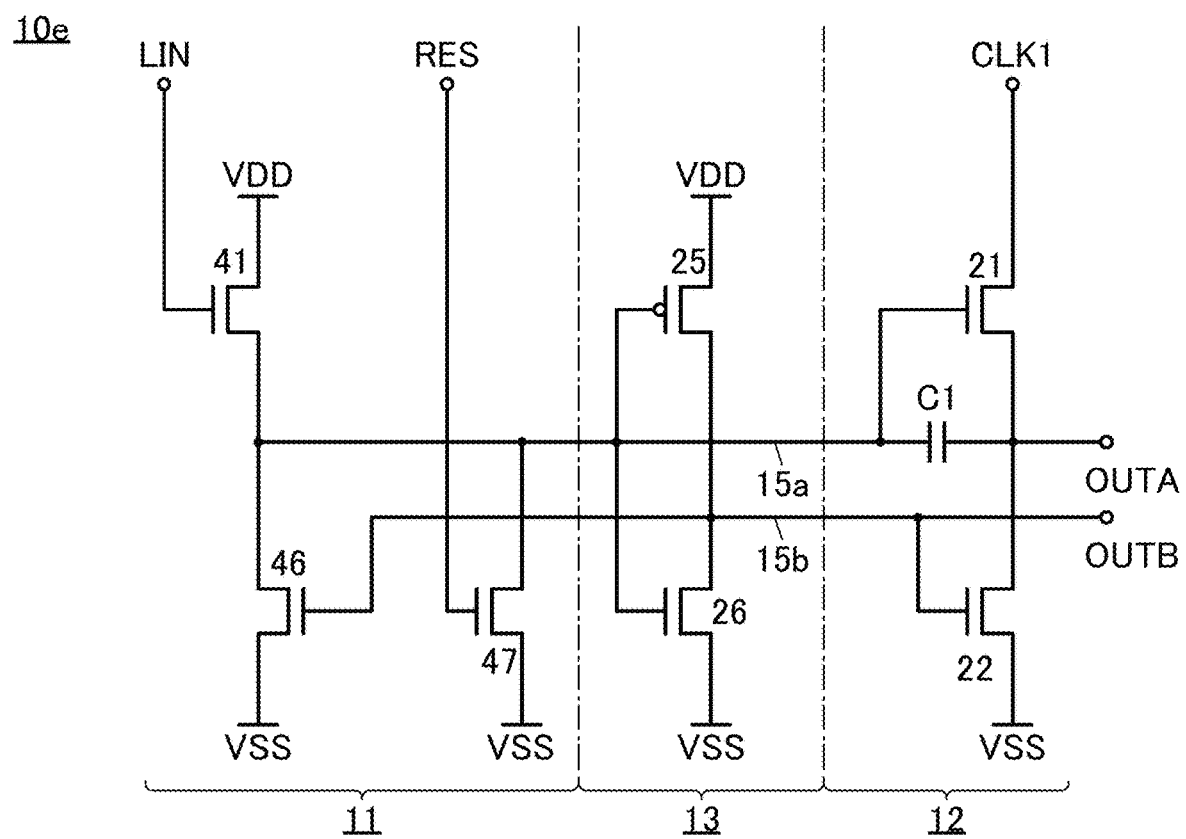
FIG. 4 is a diagram illustrating a structure example of a sequence circuit.

FIG. 4 illustrates a structure example of a sequential circuit 10e that has a different structure from the above. Note that in the sequential circuit 10e, the positions of the circuit 12 and the circuit 13 are interchanged with each other for easy understanding.

The circuit 11 includes the transistor 41, the transistor 46, and a transistor 47. In the transistor 47, a gate is electrically connected to a wiring to which a signal RES is supplied, one of a source and a drain is electrically connected to the wiring 15a, and the other thereof is electrically connected to the wiring to which the potential VSS is supplied.

A signal for controlling a reset operation of the sequential circuit 10e is supplied to the signal RES, for example.

In the circuit 13, the gates of the transistor 25 and the transistor 26 are electrically connected to the wiring 15a. In addition, the output terminal OUTB and the wiring 15b are electrically connected to each other.

The circuit 12 includes the transistor 21, the transistor 22, and the capacitor C1.

In the transistor 21, the gate is electrically connected to the wiring 15a, one of the source and the drain is electrically connected to the wiring to which the signal CLK1 is supplied, and the other thereof is electrically connected to the output terminal OUTA. In the transistor 22, the gate is electrically connected to the wiring 15b, one of the source and the drain is electrically connected to the output terminal OUTA, and the other thereof is electrically connected to the wiring to which the potential VSS is supplied. In the capacitor C1, one electrode is electrically connected to the wiring 15a and the gate of the transistor 21, and the other electrode is electrically connected to the output terminal OUTA.

In the sequential circuit 10e, a high potential is supplied to the signal LIN, and even after the high potential changes to a low potential later, signals output to the output terminal OUTA and the output terminal OUTB are retained. Furthermore, when a high potential is supplied to the signal RES and the transistor 47 is turned on, the potential VSS that is a low potential is supplied to the wiring 15a, so that the state of the sequential circuit 10e can be reset.

Structure Example 2-5

Figure 5A:
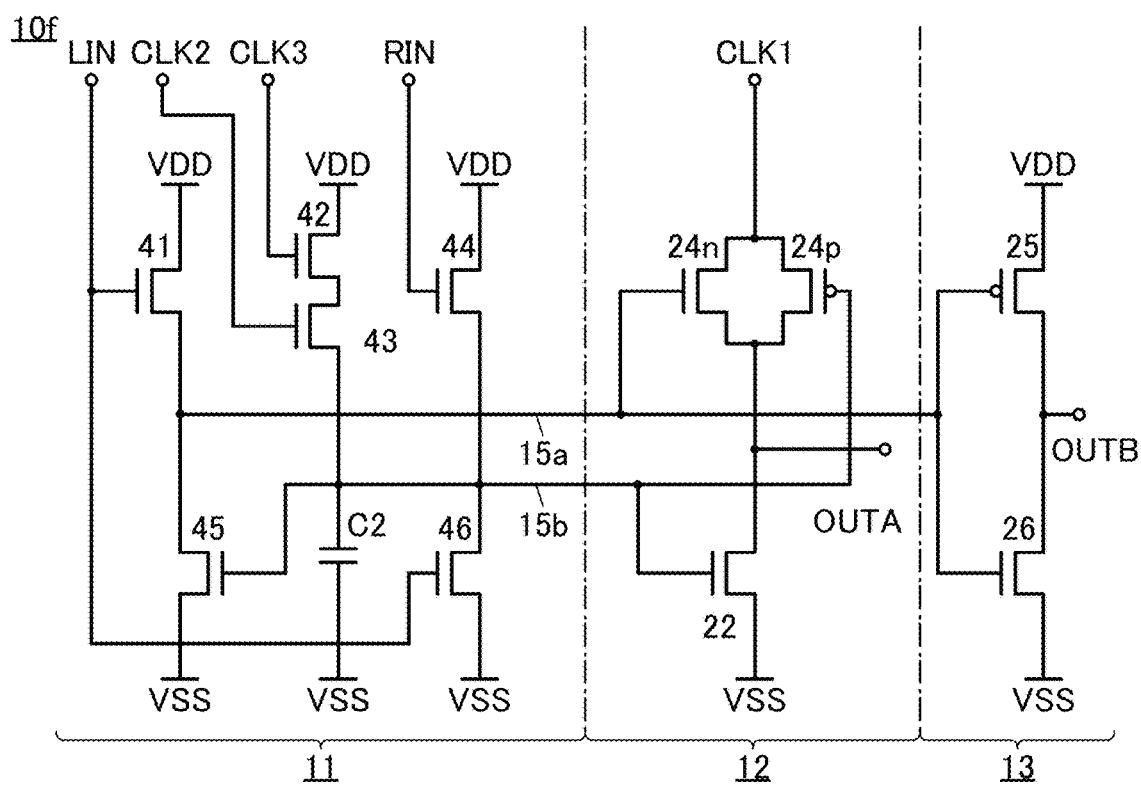
FIG. 5A and FIG. 5B are diagrams illustrating structure examples of a sequence circuit.

FIG. 5A illustrates a structure example of a sequential circuit 10f that has a different structure from the above. The sequential circuit 10f is different from the sequential circuit 10a mainly in the structure of the circuit 12.

The circuit 12 includes the transistor 22, a transistor 24n, and a transistor 24p. The transistor 24n is an n-channel transistor, and the transistor 24p is a p-channel transistor.

One of sources and drains of the transistor 24n and the transistor 24p are electrically connected to each other and the others of the sources and the drains are electrically connected to each other to form what is called an analog switch. A gate of the transistor 24n and a gate of the transistor 24p are electrically connected to the wiring 15a and the wiring 15b, respectively. When the wiring 15a is at a high potential and the wiring 15b is at a low potential, the analog switch is turned on and the transistor 22 is turned off, whereby the wiring to which the signal CLK1 is supplied and the output terminal OUTA are electrically connected. Meanwhile, when the wiring 15a is at a low potential and the wiring 15b is at a high potential, the analog switch is turned off and the transistor 22 is turned on, whereby the wiring to which the potential VSS is supplied and the output terminal OUTA are electrically connected.

In this manner, a p-channel transistor can be used not only in the circuit 13 bus also in other circuit. An example in which a p-channel transistor is used in the circuit 12 is illustrated here; however, a p-channel transistor can also be used in the circuit 11.

Note that although the circuit 11 and the circuit 13 each have a structure similar to that of the sequential circuit 10a here, the structure is not limited thereto, and a variety of structures given as examples above can be employed. For example, when the output terminal OUTB of the circuit 13 and the wiring 15b are electrically connected to each other, some transistors of the circuit 11 can be omitted, so that the circuit can be simplified.

Figure 5B:
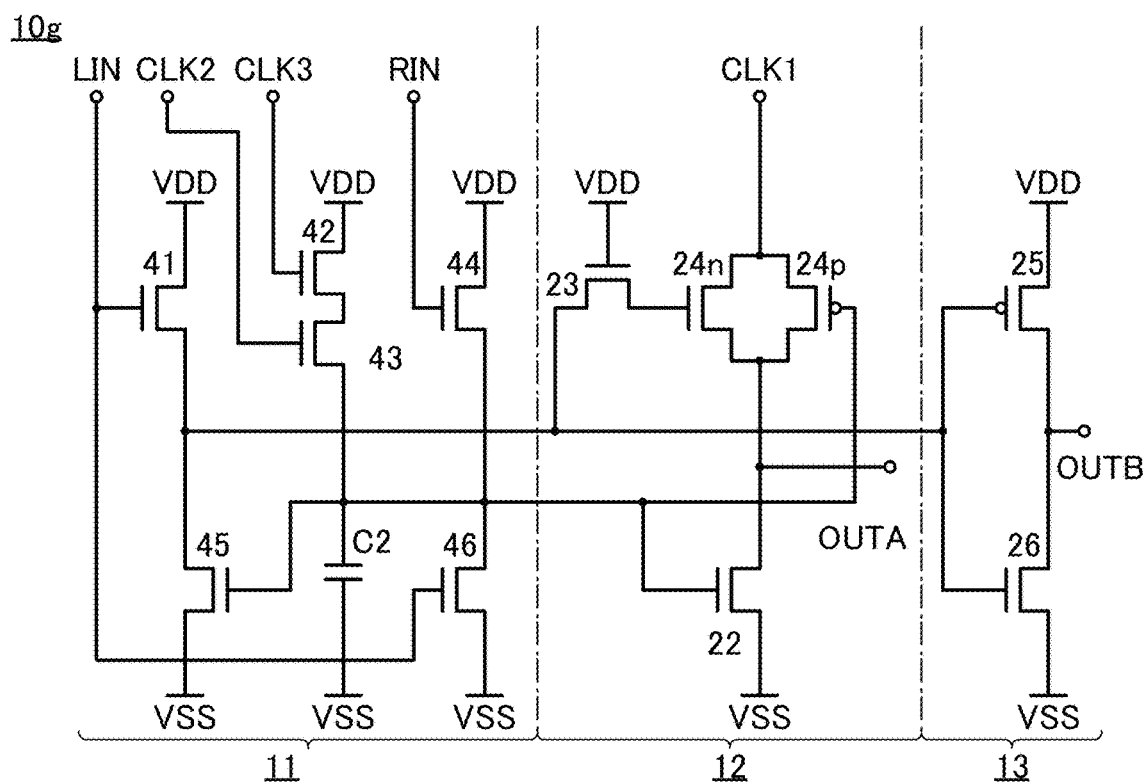

FIG. 5B illustrates a sequential circuit 10g that has a structure partly different from the above. The sequential circuit 10g further includes the transistor 23 in the circuit 12.

In the transistor 23, the gate is supplied with the potential VDD, one of the source and the drain is electrically connected to the wiring 15a, and the other thereof is electrically connected to the gate of the transistor 24n. With the transistor 23, a potential higher than the potential VDD can be supplied to the gate of the transistor 24n in a manner similar to the above, whereby the influence of the threshold voltage of the transistor 24n can be inhibited.

Although not illustrated here, the capacitor C1 may be provided between the gate of the transistor 24n and the output terminal OUTA as in the sequential circuit 10a.

Variation Example

Figure 6A:
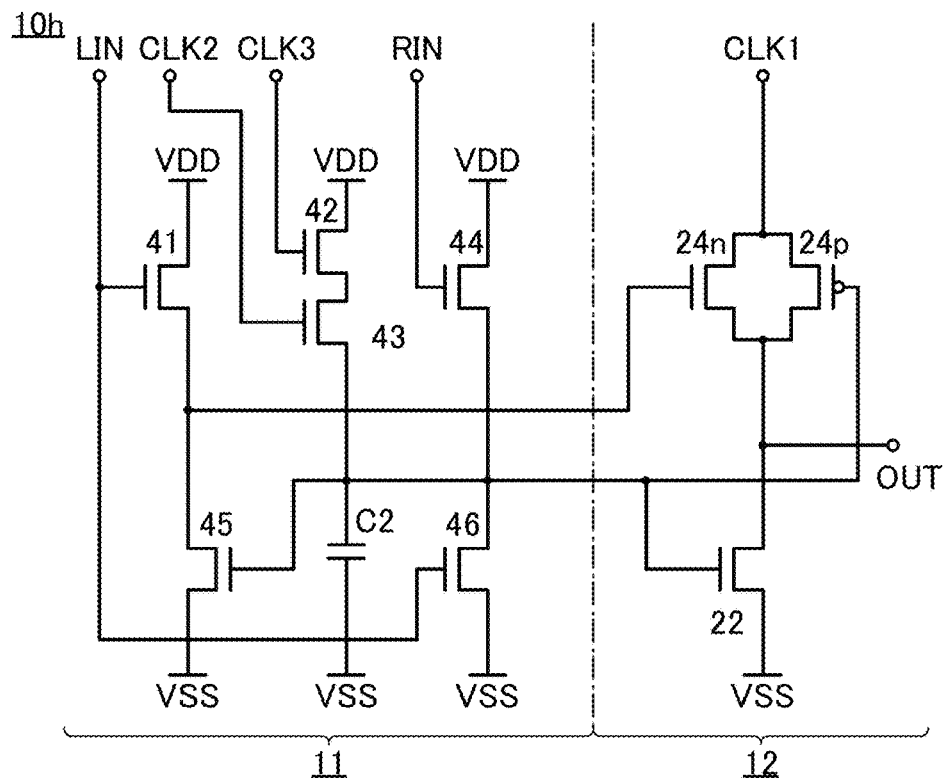
FIG. 6A and FIG. 6B are diagrams illustrating structure examples of a sequence circuit.

A sequential circuit 10h illustrated in FIG. 6A is an example in which the circuit 13 is omitted from the sequential circuit 10f. The sequential circuit 10h can output the signal CLK1 or the potential VSS from an output terminal OUT.

Figure 6B:
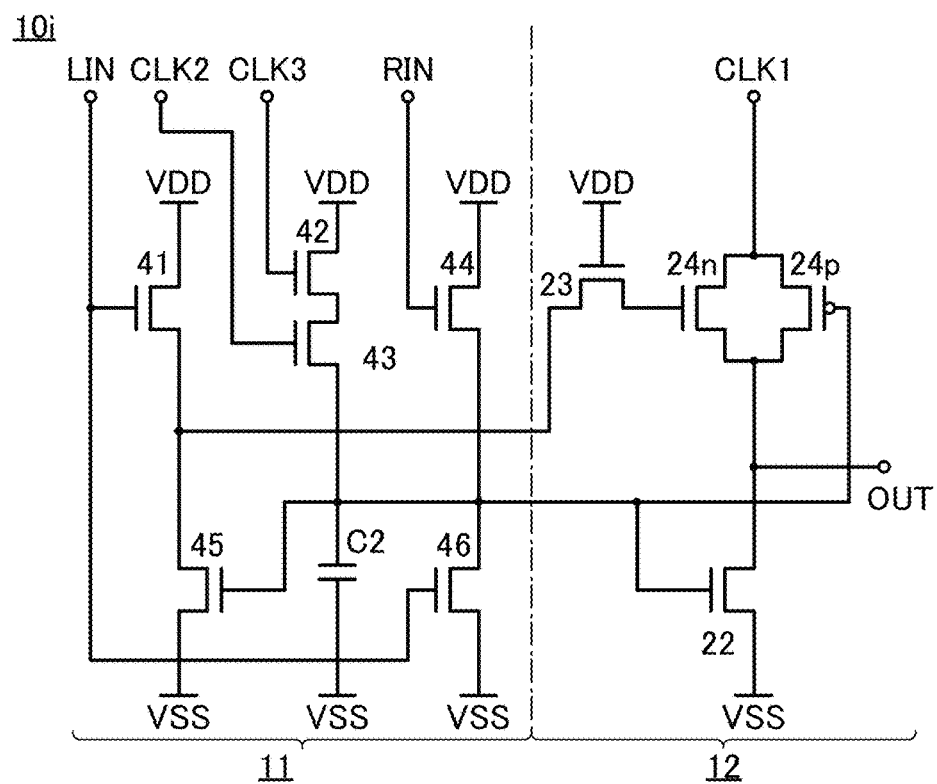

A sequential circuit 10i illustrated in FIG. 6B is an example in which the transistor 23 is added to the circuit 12 of the sequential circuit 10h.

The above is the description of the variation example.

Note that in the sequential circuit 10c to the sequential circuit 10i, the transistor including a back gate described as an example in the above sequential circuit 10b may be used as an n-channel transistor. In this case, a transistor in which a pair of gates are electrically connected to each other, a transistor in which one gate is electrically connected to a source, or a transistor without a back gate is preferably selected to be used.

Structure Example of Driver Circuit

An example of a driver circuit that is formed by connecting a plurality of stages of sequential circuits and functions as a shift register is described below.

Structure Example 1 of Driver Circuit

FIG. 7A is a diagram illustrating input and output terminals of a sequence circuit 30. The sequence circuit 30 includes, as input terminals, terminals to which the signal LIN, the signal RIN, the signal CLK1, the signal CLK2, and the signal CLK3 are input, and includes, as output terminals, the output terminal OUTA and the output terminal OUTB. As the sequential circuit 30, for example, the sequential circuit 10a, the sequential circuit 10b, the sequential circuit 10c, or the like can be used.

FIG. 7B illustrates a structure example of a driver circuit 40. The driver circuit 40 includes a plurality of sequential circuits 30. FIG. 7B illustrates a sequential circuit 30_1 to a sequential circuit 30_6. The n-th sequential circuit from the side close to the input of the driver circuit 40 will be referred to as the sequential circuit 30_n (n is an integer greater than or equal to 1) below.

In the sequential circuit 30_n, any three of a signal CK1 to a signal CK4 are used as the signal CLK1, the signal CLK2, and the signal CLK3. Every four stages have the same combination of any three of the signal CK1 to the signal CK4. That is, the same signals are input to the sequential circuit 30_n and the sequential circuit 30_n+4 as the signal CLK1, the signal CLK2, and the signal CLK3.

The output terminal OUTA and the output signal OUTB of the sequential circuit 30_n are connected to a wiring OUTAn and a wiring OUTBn which are output wirings, respectively.

A signal SP is input as the signal LIN to the sequential circuit 30_1. To the sequential circuit 30_n, where n is more than or equal to 2, a signal of the output terminal OUTA of the sequential circuit 30_n−1 in the previous stage is input as the signal LIN. To the sequence circuit 30_n, a signal from the output terminal OUTA of the sequence circuit 30_n+2 is input as the signal RIN.

Specifically, the signal CK1, a signal CK2, a signal CK3, the signal SP, and a signal of the output terminal OUTA of the sequential circuit 30_3 are input to the sequential circuit 30_1, and the sequential circuit 30_1 outputs an output signal to a wiring OUTA1 and a wiring OUTB1. In addition, the signal CK2, the signal CK3, the signal CK4, a signal of the output terminal OUTA of the sequential circuit 30_1, and a signal of the output terminal OUTA of the sequential circuit 30_4 are input to the sequential circuit 30_2, and the sequential circuit 30_2 outputs an output signal to a wiring OUTA2 and a wiring OUTB2.

FIG. 7C is a timing chart showing a driving method for the driver circuit 40. FIG. 7C shows, from the top, potential changes over time in the signal SP, the signal CK1 to the signal CK4, the wiring OUTA1 to a wiring OUTA6, and the wiring OUTB1 to a wiring OUTB6.

At Time T0, the signal SP becomes a high potential and the signal CK1 is a low potential. At this time, a low potential is output to the wiring OUTA1 to the wiring OUTA6, and a high potential is output to the wiring OUTB2 to the wiring OUTB6. When the signal SP becomes a high potential, a low potential is output to the wiring OUTB1.

At Time T1, the signal CK1 becomes a low potential to a high potential, so that a high potential is output from the sequence circuit 30_1 to the wiring OUTA1 and the wiring OUTB1 remains at the low potential. At time T1, a low potential is output to the wiring OUTB2. After that, with the signal CK1 to the signal CK4, high potentials are sequentially output to the wiring OUTA2 and the subsequent wirings and low potentials are sequentially output to the wiring OUTB2 and the subsequent wirings.

The signal CK1 to the signal CK4 are clock signals that are shifted by a quarter of one cycle period. Thus, as shown in FIG. 7C, signals that are shifted by a quarter of one cycle period, e.g., the signal CK1, are output to the wiring OUTA1 to the wiring OUTA6 and the wiring OUTB1 to the wiring OUTB6.

Structure Example 2 of Driver Circuit

FIG. 8A illustrates a structure example of a driver circuit 40a that has a structure partly different from the above.

The signal CK1 and the signal CK2 are supplied to the driver circuit 40a as clock signals. The driver circuit 40a includes a plurality of inverter circuits 80.

One of the signal CK1 and the signal CK2 is input to an input terminal of each of the inverter circuits 80, and an inverted signal thereof is output from an output terminal of each of the inverter circuits 80. The two inverted signals are signals that are shifted by half of one cycle period from the cycle periods of the signal CK1 and the signal CK2, respectively, and thus are signals similar to the signal CK3 and the signal CK4 in Structure example 1 above.

In FIG. 8A, a pair of inverter circuits 80 are provided for every four sequential circuits 30_n. More specifically, three sequential circuits 30 are connected to one inverter circuit 80. When the number of sequential circuits connected to one inverter circuit 80 is reduced in this manner, the output capability required for the inverter circuit 80 can be reduced, so that the circuit size can be reduced.

In the inverter circuit 80, a transistor formed through the same steps as the sequential circuit 30 is preferably used. FIG. 8B illustrates a structure example applicable to the inverter circuit 80. The inverter circuit 80 has a structure similar to that of the circuit 13 and includes a p-channel transistor 81 and an n-channel transistor 82. As illustrated in FIG. 8B, when the clock signal CK is input to the inverter circuit 80, an inverted clock signal CKB obtained by inverting the clock signal CK can be output, for example.

Note that the structure of the driver circuit is not limited to this, and a signal, a wiring, and the like can be changed as appropriate depending on the structure of a sequential circuit to be used. For example, when a sequential circuit with a small number of input signals like the sequential circuit 10d and the sequential circuit 10e is used, one or both of a wiring and a signal can be reduced, leading to a simplified driver circuit.

The above is the description of the structure examples of the driver circuit.

Structure Example of Display Device

Structure example of a display device in which a driver circuit of one embodiment of the present invention can be used is described.

Figure 9A:
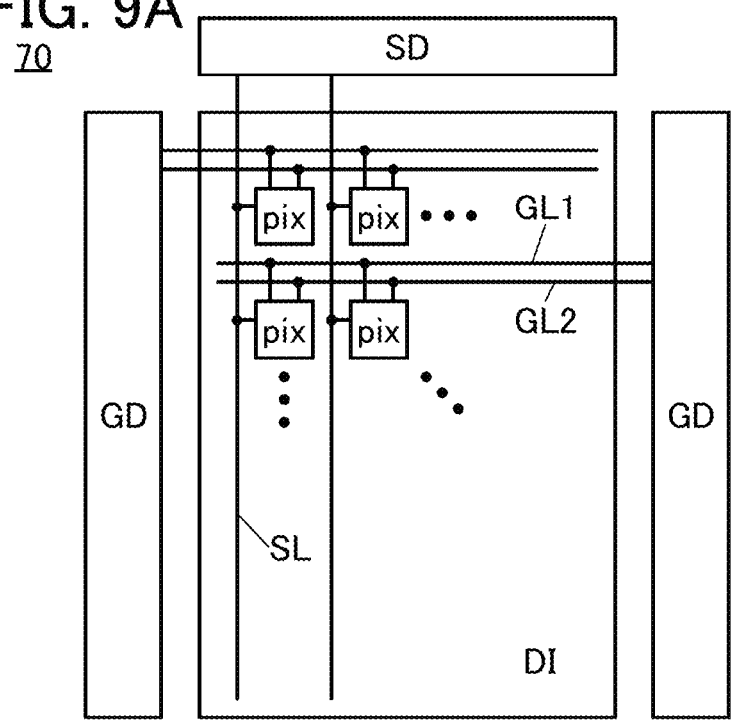
FIG. 9A is a block diagram of a display device.

FIG. 9A illustrates a block diagram of a display device 70. The display device 70 includes a display portion DI, a pair of driver circuits GD, and a driver circuit SD.

In the display portion DI, a plurality of pixels pix are arranged in a matrix. The pixels pix each include one or more display elements and one or more transistors.

The driver circuit GD functions as a gate line driver circuit (also referred to as a scan line driver circuit or a gate driver). The driver circuit SD functions as a source line driver circuit (also referred to as a signal line driver circuit or a source driver).

A variety of sequential circuits, which are described above as examples, and a driver circuit including the sequential circuit can be used as the driver circuit GD.

Among the pixels pix provided in the display portion DI, the pixels pix located in the odd-numbered rows are electrically connected to one of the driver circuits GD, and the pixels pix located in the even-numbered rows are electrically connected to the other driver circuit. With such a structure, the area occupied by each of the driver circuits GD can be reduced, and a display device with a narrow bezel can be obtained.

Here, the driver circuit GD and the pixel pix are electrically connected to each other through a scanning line GL1 and a scanning line GL2. The driver circuit SD and the pixel pix are electrically connected to each other through a signal line SL.

Here, an output signal of the output terminal OUTA of the sequential circuit described above as an example is supplied to the scanning line GL1. An output signal of the output terminal OUTB is supplied to the scanning line GL2. Thus, the scanning line GL1 is always supplied with a high potential in a selected state and is always supplied with a low potential in a non-selected state. By contrast, the scanning line GL2 is always supplied with a low potential in a selected state and is always supplied with a high potential in a non-selected state.

Figure 9B:
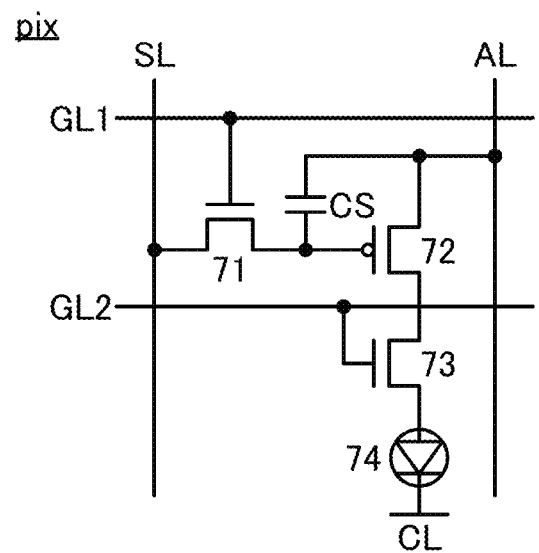
FIG. 9B is a circuit diagram of a pixel.

FIG. 9B illustrates an example of the pixel pix. The pixel pix is an example in which a light-emitting element is used as the display element. The pixel pix includes a transistor 71, a transistor 72, a transistor 73, a light-emitting element 74, and a capacitor CS. The transistor 71 functions as a selection transistor. The transistor 72 functions as a driving transistor that controls current flowing to the light-emitting element 74. The transistor 73 has a function of controlling current flowing through the light-emitting element 74. The transistor 71 and the transistor 73 are n-channel transistors, and the transistor 72 is a p-channel transistor.

In the transistor 71, a gate is electrically connected to the scanning line GL1, one of a source and a drain is electrically connected to the signal line SL, and the other thereof is electrically connected to a gate of the transistor 72 and one electrode of the capacitor CS. In the transistor 72, one of a source and a drain is electrically connected to a wiring AL and the other electrode of the capacitor CS, and the other thereof is electrically connected to one of a source and a drain of the transistor 73. In the transistor 73, a gate is electrically connected to the scanning line GL2, and the other of the source and the drain is electrically connected to one electrode of the light-emitting element 74. The other electrode of the light-emitting element 74 is electrically connected to a wiring CL. The wiring AL is supplied with an anode potential, and the wiring CL is supplied with a cathode potential that is lower than the anode potential.

When the potential of the signal line SL is written to the pixel pix, a high potential is supplied to the scanning line GL1, and the transistor 71 is turned on. At this time, a low potential is supplied to the scanning line GL2; thus, the transistor 73 is turned off, and current flowing through the light-emitting element 74 is blocked. In this manner, at the time of writing data to the pixel pix, light emission with unintended luminance of the light-emitting element 74 can be prevented, so that the display quality can be improved.

After the writing operation to the pixel pix is finished, a low potential is supplied to the scanning line GL1, and the transistor 71 is turned off. A high potential is supplied to the scanning line GL2; thus, the transistor 73 is turned on, and current corresponding to the gate potential of the transistor 72 flows to the light-emitting element 74 through the transistor 73.

Note that the structure of the pixel pix is not limited thereto, and a variety of structures can be employed. For example, a structure is preferably employed in which at least transistors each include a gate connected to the corresponding scanning line GL1 and scanning line GL2.

The above is the description of the structure example of the display device.

Structure Example of Transistor

More specific structure examples of a transistor that can be used in the sequential circuits, the driver circuits, the display devices, and the like described above as examples are described below. Here, an inverter circuit that includes a transistor containing polycrystalline silicon in a channel formation region (LTPS transistor) and a transistor including an oxide semiconductor in a channel formation region (OS transistor) is described as an example.

Structure Example 1

Figure 10A:
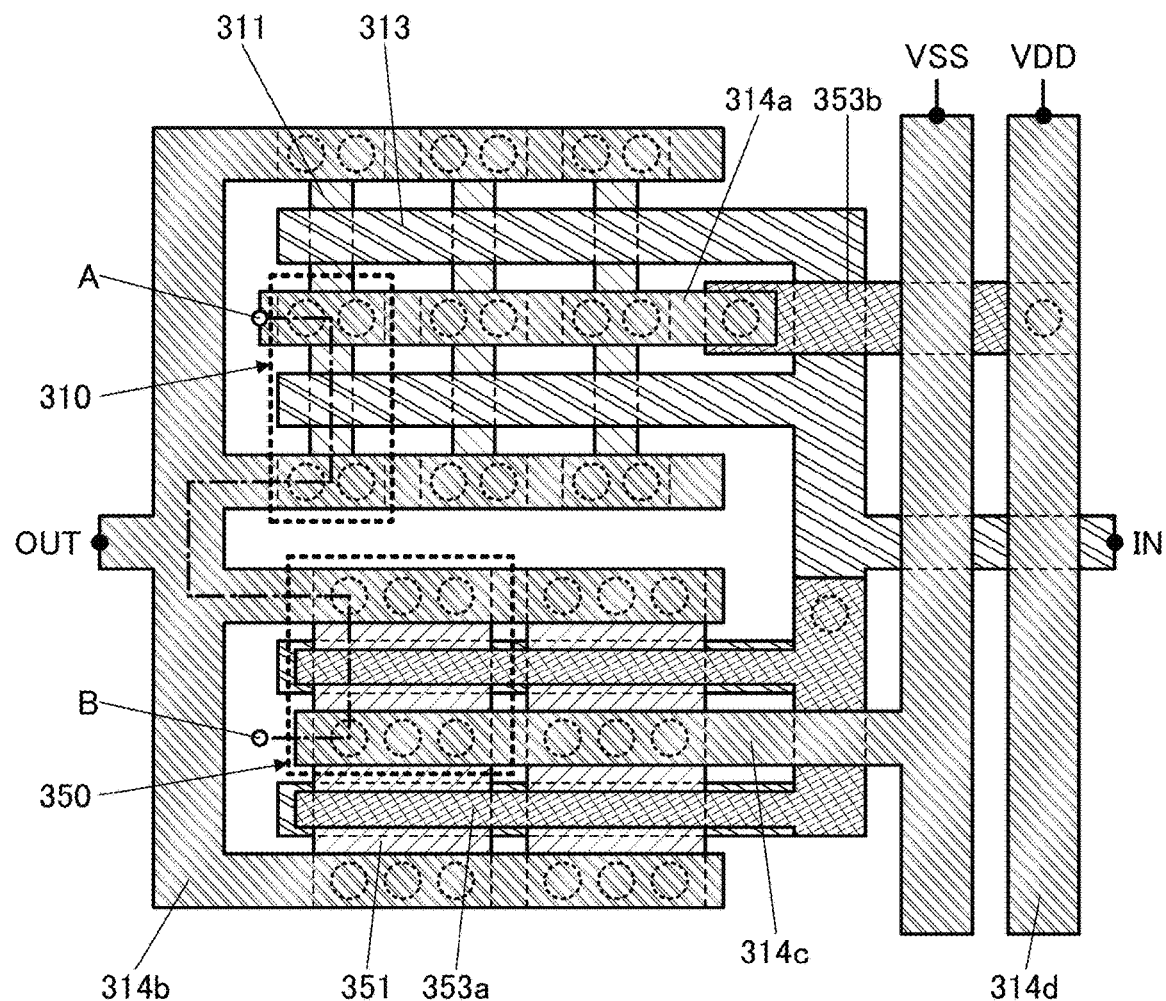
FIG. 10A is a schematic top view of an inverter circuit.

FIG. 10A illustrates a schematic top view of an inverter circuit. The inverter circuit includes a transistor 310 and a transistor 350. The transistor 310 is an LTPS transistor, and the transistor 350 is an OS transistor. The transistor 310 can be used as the transistor 25 or the like described in the above as an example. The transistor 350 can be used as the transistor 26 or the like described in the above as an example.

As the OS transistor, a transistor including an oxide semiconductor in a semiconductor layer where a channel is formed can be used. The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Further alternatively, it is preferable to use an oxide containing indium, gallium, tin, and zinc.

A transistor using an oxide semiconductor having a wider band gap and a lower carrier density than silicon can achieve an extremely low off-state current. Thus, such a low off-state current enables long-term retention of charge accumulated in a capacitor that is connected in series with the transistor.

Part of a conductive layer 313 illustrated in FIG. 10A functions as an input terminal IN. Part of a conductive layer 314b functions as part of the output terminal OUT. Part of a conductive layer 314c functions as a wiring to which the potential VSS is supplied. Part of a conductive layer 314d functions as the wiring to which the potential VDD is supplied.

FIG. 10A illustrates an example in which six transistors 310 connected in parallel and four transistors 350 connected in parallel are provided. In the case where a large amount of current needs to flow or the like, not one transistor with a large channel width is used, but transistors with relatively small channel lengths are used in parallel, whereby heat generation due to current can be reduced, and the reliability of a circuit can be improved.

Figure 10B:
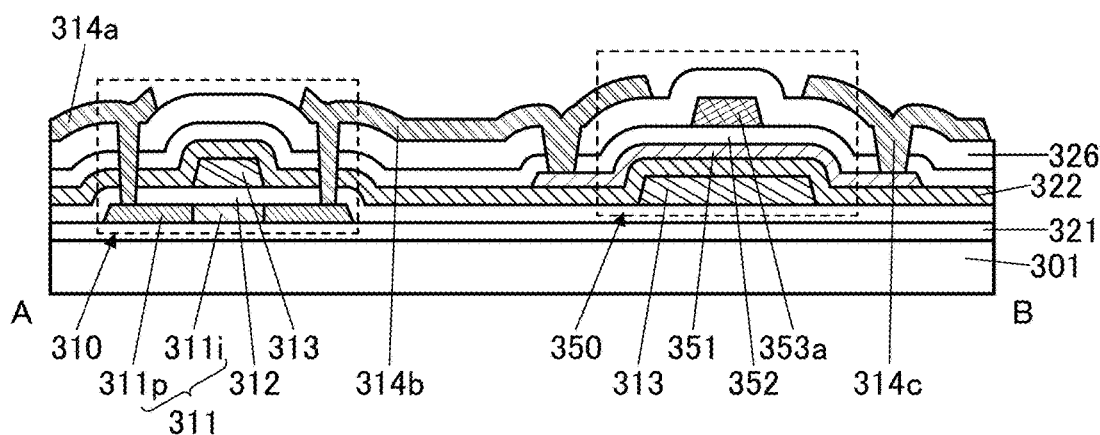
FIG. 10B is a schematic cross-sectional view of the inverter circuit.

FIG. 10B is a schematic cross-sectional view along the dashed-dotted line A-B in FIG. 10A. FIG. 10B illustrates cross sections of the transistor 310 and the transistor 350 in the channel length direction.

An insulating layer 321 is provided over a substrate 301, and the transistor 310 and the transistor 350 are provided over the insulating layer 321.

The transistor 310 is positioned over a semiconductor layer 311, an insulating layer 312 covering the semiconductor layer 311, and the insulating layer 312, and includes the conductive layer 313 overlapping with the semiconductor layer 311. An insulating layer 322 covering the conductive layer 313 and the insulating layer 312, an insulating layer 352 over the insulating layer 322, an insulating layer 326 over the insulating layer 352, and the like are provided. The semiconductor layer 311 contains polycrystalline silicon. The semiconductor layer 311 includes a channel formation region 311i and a pair of low-resistance regions 311p with the channel formation region 311i therebetween. Part of the insulating layer 312 functions as a gate insulating layer of the transistor 310. Part of the conductive layer 313 functions as a gate electrode of the transistor 310.

The insulating layer 322 preferably has a stacked-layer structure of a first insulating film having a barrier property against hydrogen and water and a second insulating film containing oxide. The first insulating film corresponds to the insulating layer 62 and the second insulating film corresponds to the insulating layer 63 illustrated in FIG. 1C and the like. For materials or the like that can be used for the first insulating film and the second insulating film, the above description can be referred to.

The low-resistance regions 311p contain an impurity element. For example, in the case where the transistor 310 is an n-channel transistor, phosphorus, arsenic, or the like is added to the low-resistance regions 311p. Meanwhile, in the case where the transistor 310 is a p-channel transistor, boron, aluminum, or the like is added to the low-resistance regions 311p. Here, the transistor 310 is a p-channel transistor. In addition, in order to control the threshold voltage of the transistor 310, the above-described impurity may be added to the channel formation region 311i.

The transistor 350 includes the conductive layer 313 over the insulating layer 312, the insulating layer 322 covering the conductive layer 313, a semiconductor layer 351 over the insulating layer 322, the insulating layer 352 covering the semiconductor layer 351, and a conductive layer 353a positioned over the insulating layer 352 and overlapping with the semiconductor layer 351. Furthermore, the insulating layer 326 is provided to cover the insulating layer 352 and the conductive layer 353a. The semiconductor layer 351 includes an oxide semiconductor.

A region of the semiconductor layer 351, which overlaps with one or both of the conductive layer 353a and the conductive layer 313, functions as a channel formation region. Part of the insulating layer 322 functions as a back gate insulating layer (a second gate insulating layer) of the transistor 350. Part of the insulating layer 352 functions as a gate insulating layer (a first gate insulating layer) of the transistor 350. Another part of the conductive layer 313 functions as a back gate electrode (a second gate electrode) of the transistor 350. Part of the conductive layer 353a functions as a gate electrode (a first gate electrode) of the transistor 350.

A conductive layer 314a, the conductive layer 314b, and the conductive layer 314c are provided over the insulating layer 326. The conductive layer 314a and the conductive layer 314b are provided over the insulating layer 326, the insulating layer 352, the insulating layer 322, and the insulating layer 312, and electrically connected to a low-resistance region in opening portions reaching the low-resistance regions 311p. The conductive layer 314b and the conductive layer 314c are provided in the insulating layer 326 and the insulating layer 352, and electrically connected to the semiconductor layer 351 in opening portions reaching the semiconductor layer 351.

As illustrated in FIG. 10A and FIG. 10B, the conductive layer 313 serves as the gate electrode of the transistor 310 and the back gate electrode of the transistor 350. The conductive layer 353a and the conductive layer 313 are electrically connected to each other in an opening portion indicated by a dashed line, and the same potential input from the input terminal IN is supplied to them.

A structure example of a transistor whose structure is partly different from that of the above is described below.

Structure Example 2

Figure 11A:
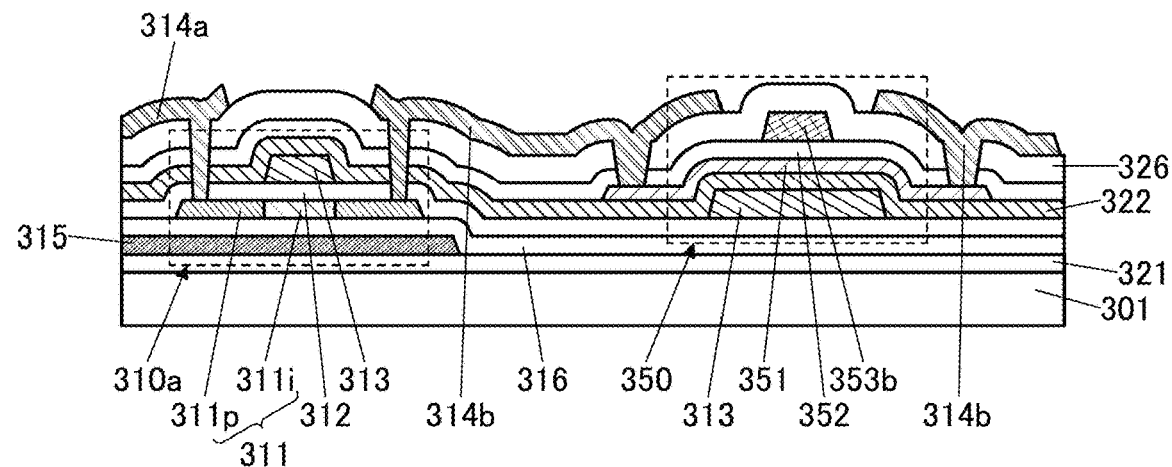
FIG. 11A to FIG. 11C are schematic cross-sectional views of inverter circuits.

FIG. 11A illustrates an example in which instead of the transistor 310, a transistor 310a including a pair of gate electrodes is used. The transistor 310a is different from the transistor 310 mainly in including a conductive layer 315 and an insulating layer 316.

The conductive layer 315 is provided over the insulating layer 321. The insulating layer 316 is provided to cover the conductive layer 315 and the insulating layer 321. The semiconductor layer 311 is provided such that at least the channel formation region 311i overlaps with the conductive layer 315 with the insulating layer 316 therebetween.

In the transistor 310a, part of the conductive layer 313 functions as a first gate electrode, and part of the conductive layer 315 functions as a second gate electrode. At this time, part of the insulating layer 312 functions as a first gate insulating layer, and part of the insulating layer 316 functions as a second gate insulating layer.

Here, to electrically connect the first gate electrode to the second gate electrode, the conductive layer 313 is electrically connected to the conductive layer 315 through an opening portion provided in the insulating layer 312 and the insulating layer 316 in a region not illustrated. To electrically connect the second gate electrode to a source or a drain, the conductive layer 315 is electrically connected to the conductive layer 314a or the conductive layer 314b through an opening portion provided in the insulating layer 322, the insulating layer 312, and the insulating layer 316 in a region not illustrated.

Structure Example 3

Figure 11B:
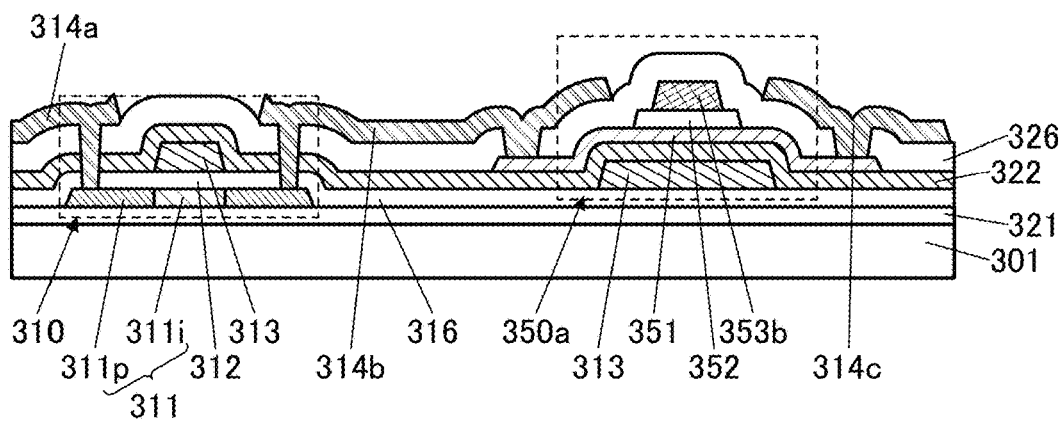

FIG. 11B illustrates an example in which a transistor 350a is used instead of the transistor 350 in FIG. 10B. The transistor 350a is different from the transistor 350 mainly in the shape of the insulating layer 352.

The insulating layer 352 is processed using the same resist mask as a conductive layer 353b. A region of the semiconductor layer 351 which is not covered with the insulating layer 352 has a surface that is in contact with the insulating layer 326. In regions of the semiconductor layer 351, which are in contact with the insulating layer 326, more carriers exist than those in a channel formation region, whereby electrical resistance can be favorably reduced.

FIG. 11B illustrates an example in which end portions of the conductive layer 353b are positioned inward from end portions of the insulating layer 352. With such a structure, in the semiconductor layer 351, a region having relatively high resistance can be provided between a channel formation region and a low-resistance region. In other words, an LDD (Lightly Doped Drain) structure is formed, leading to an increase in the reliability. Note that the structure is not limited thereto, and processing may be performed such that the end portions of the conductive layer 353b and the end portions of the insulating layer 352 are substantially aligned with each other, and the top surface shapes of the insulating layer 352 and the conductive layer 353b are substantially the same.

Note that in this specification and the like, the expression "having substantially the same top surface shapes" means that at least outlines of stacked layers partly overlap with each other. For example, the case of processing an upper layer and a lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such a case is also represented by the expression "top surface shapes are substantially aligned with each other".

Structure Example 4

Figure 11C:
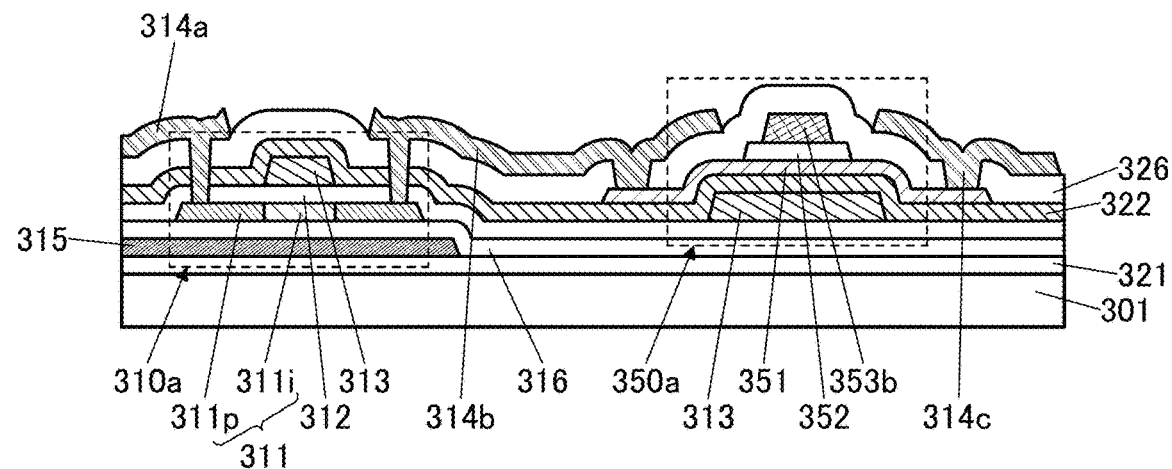

FIG. 11C illustrates an example of the case where the transistor 310a and the transistor 350a are used. For the structures of the transistor 310a and the transistor 350a, the above description can be referred to.

The above is the description of structure examples of the transistors.

[Metal Oxide]

A metal oxide that can be used in the semiconductor layer of the OS transistor is described below.

Note that in this specification and the like, a metal oxide containing nitrogen is also referred to as a metal oxide in some cases. A metal oxide containing nitrogen may be called a metal oxynitride. For example, a metal oxide containing nitrogen, such as zinc oxynitride (ZnON), may be used for the semiconductor layer.

Note that in this specification and the like, CAAC (c-axis aligned crystal) and CAC (Cloud-Aligned Composite) may be stated. Note that CAAC refers to an example of a crystal structure, and CAC refers to an example of a function or a material composition.

For example, a CAC (Cloud-Aligned Composite)-OS (Oxide Semiconductor) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current drive capability, that is, a high on-state current and high field-effect mobility.

In other words, the CAC-OS or the CAC-metal oxide can also be referred to as a matrix composite or a metal matrix composite.

Oxide semiconductors (metal oxides) are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to the low density of oxygen atom arrangement in the a-b plane direction, a change in interatomic bond distance by replacement of a metal element, or the like.

The CAAC-OS tends to have a layered crystal structure (also referred to as a layered structure) in which a layer containing indium and oxygen (hereinafter, In layer) and a layer containing an element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is less likely to occur. In addition, the mixing of impurities, formation of defects, or the like might decrease the crystallinity of a metal oxide; thus, it can be said that the CAAC-OS is a metal oxide that has small amounts of impurities and defects (oxygen vacancies (also referred to as $V_O$) or the like). Hence, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an indium-gallium-zinc oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The substrate temperature during the formation of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the formation of the metal oxide film is preferably room temperature, in which case productivity can be increased.

The metal oxide film can be formed by a sputtering method. Alternatively, a PLD method, a PECVD method, a thermal CVD method, an ALD method, or a vacuum evaporation method, for example, may be used.

The above is the description of the metal oxide.

At least part of this embodiment can be implemented in combination with the other embodiments described in this specification as appropriate.

Embodiment 2

In this embodiment, a display device that includes the semiconductor device of one embodiment of the present invention is described with reference to FIG. 12A to FIG. 12C.

Figure 12A:
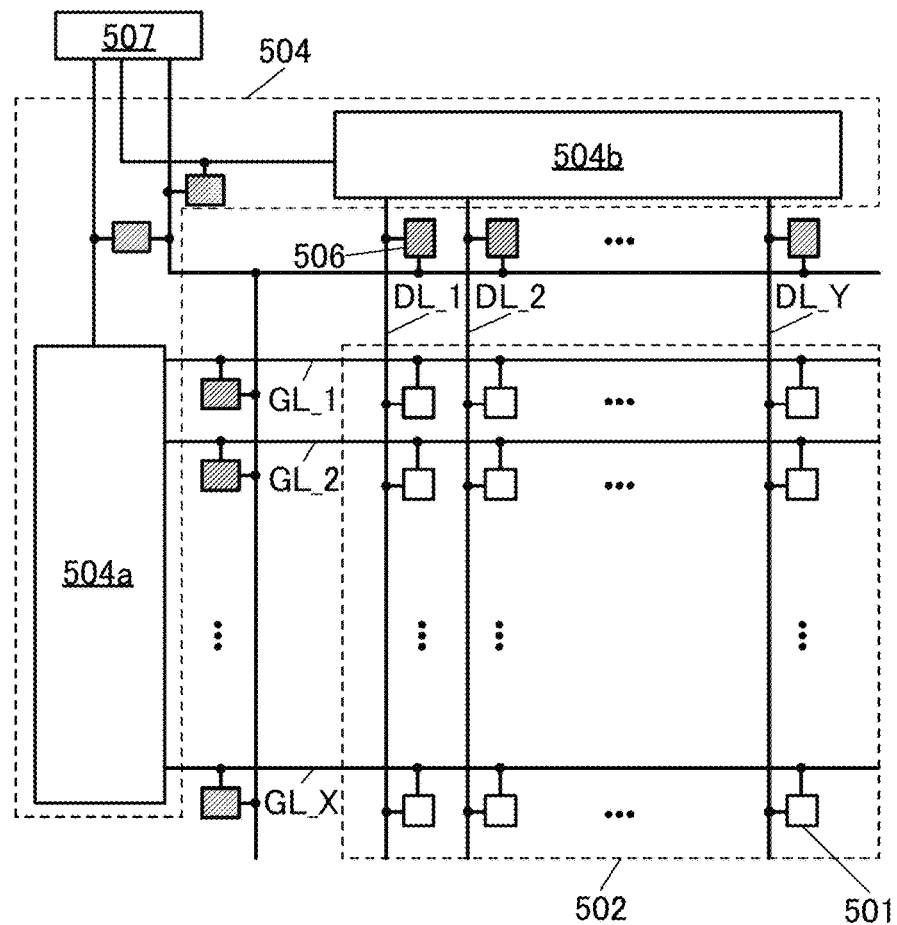
FIG. 12A is a block diagram of a display device.

A display device illustrated in FIG. 12A includes a pixel portion 502, a driver circuit portion 504, protection circuits 506, and a terminal portion 507. Note that a structure in which the protection circuits 506 are not provided may be employed.

The pixel portion 502 includes pixel circuits 501 arranged in X rows and Y columns (X and Y each independently represent a natural number greater than or equal to 2). Each of the pixel circuits 501 includes a circuit for driving a display element.

The driver circuit portion 504 includes driver circuits such as a gate driver 504a that outputs a scan signal to a gate line GL_1 to a gate line GL_X and a source driver 504b that supplies a data signal to a data line DL_1 to a data line DL_Y. The gate driver 504a includes at least a shift register. The source driver 504b is formed using a plurality of analog switches, for example. Alternatively, the source driver 504b may be formed using a shift register or the like.

The gate driver 504a can include the sequential circuit of one embodiment of the present invention. The source driver 504b may also include the sequential circuit of one embodiment of the present invention.

The terminal portion 507 refers to a portion provided with terminals for inputting power, control signals, image signals, and the like to the display device from external circuits.

The protection circuit 506 is a circuit that, when a potential out of a certain range is supplied to a wiring to which the protection circuit 506 is connected, establishes continuity between the wiring and another wiring. The protection circuit 506 illustrated in FIG. 12A is connected to a variety of wirings such as the gate lines GL that are wirings between the gate driver 504a and the pixel circuits 501 and the data lines DL that are wirings between the source driver 504b and the pixel circuits 501, for example. Note that the protection circuits 506 are hatched in FIG. 12A to distinguish the protection circuits 506 from the pixel circuits 501.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor or a polycrystalline semiconductor) may be mounted on the substrate over which the pixel portion 502 is provided by COG or TAB (Tape Automated Bonding).

Figure 12B:
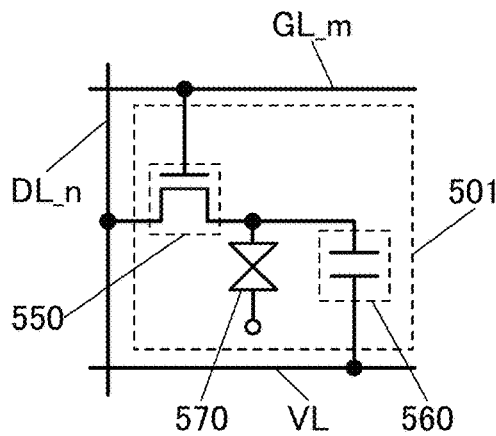
FIG. 12B and FIG. 12C are circuit diagrams of pixel circuits.
Figure 12C:
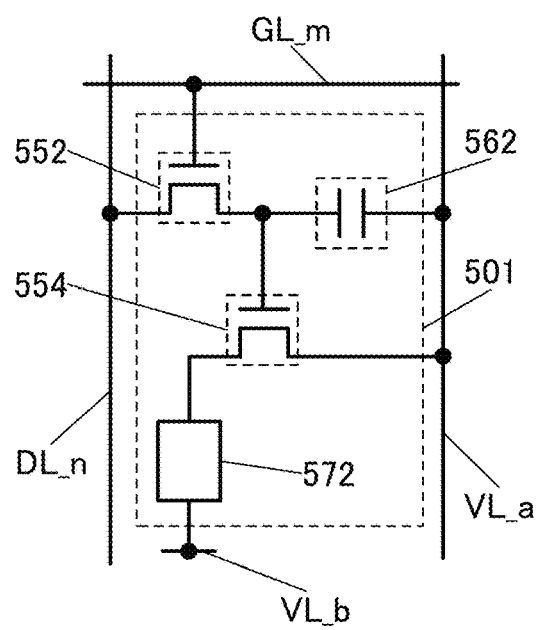

FIG. 12B and FIG. 12C each illustrate a structure example of a pixel circuit that can be used as the pixel circuit 501. FIG. 12B and FIG. 12C each illustrate the pixel circuit in the m-th row and the n-th column (m is a natural number greater than or equal to 1 and less than or equal to X, and n is a natural number greater than or equal to 1 and less than or equal to Y).

The pixel circuit 501 illustrated in FIG. 12B includes a liquid crystal element 570, a transistor 550, and a capacitor 560. The data line DL_n, the gate line GL_m, a potential supply line VL, and the like are connected to the pixel circuit 501.

The potential of one of a pair of electrodes of the liquid crystal element 570 is set as appropriate in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Moreover, a potential supplied to one of the pair of electrodes of the liquid crystal element 570 of the pixel circuit 501 may differ between rows.

The pixel circuit 501 illustrated in FIG. 12C includes a transistor 552, a transistor 554, a capacitor 562, and a light-emitting element 572. The data line DL_n, the gate line GL_m, a potential supply line VL_a, a potential supply line VL_b, and the like are connected to the pixel circuit 501.

Note that the potential VDD that is a high power supply potential is supplied to one of the potential supply line VL_a and the potential supply line VL_b, and the potential VSS that is a low power supply potential is supplied to the other. Current flowing through the light-emitting element 572 is controlled in accordance with a potential supplied to a gate of the transistor 554, whereby the luminance of light emitted from the light-emitting element 572 is controlled.

In the case where a light-emitting element is used as the display element, an EL element such as an OLED (Organic Light Emitting Diode) or a QLED (Quantum-dot Light Emitting Diode) is preferably used. Examples of a light-emitting substance included in the EL element include a substance emitting fluorescent light (a fluorescent material), a substance emitting phosphorescent light (a phosphorescent material), a substance exhibiting thermally activated delayed fluorescence (a thermally activated delayed fluorescence (TADF) material), and an inorganic compound (e.g., a quantum dot material). Alternatively, an LED such as a micro-LED (Light Emitting Diode) can be used as the light-emitting element.

Examples of the LED include a macro LED (also referred to as a huge LED), a mini LED, a micro LED, and the like in descending order in size. Here, an LED chip whose one side size is larger than 1 mm is called a macro LED, an LED chip whose one side size is larger than 100 µm and smaller than or equal to 1 mm is called a mini LED, and an LED chip whose one side size is smaller than or equal to 100 µm is called a micro LED. It is particularly preferable to use a micro LED as an LED element applied to a pixel. The use of a micro LED can achieve an extremely high-resolution display device.

It is preferable that the transistor 550 illustrated in FIG. 12B or the transistor 552 and the transistor 554 illustrated in FIG. 12C be provided over the same substrate as the transistors included in the gate driver 504a.

At least part of the structure examples, the drawings corresponding thereto, and the like described in this embodiment as examples can be implemented in combination with the other structure examples, the other drawings, and the like as appropriate.

At least part of this embodiment can be implemented in combination with the other embodiments described in this specification as appropriate.

Embodiment 3

In this embodiment, a display module that can be fabricated using one embodiment of the present invention is described.

Figure 13A:
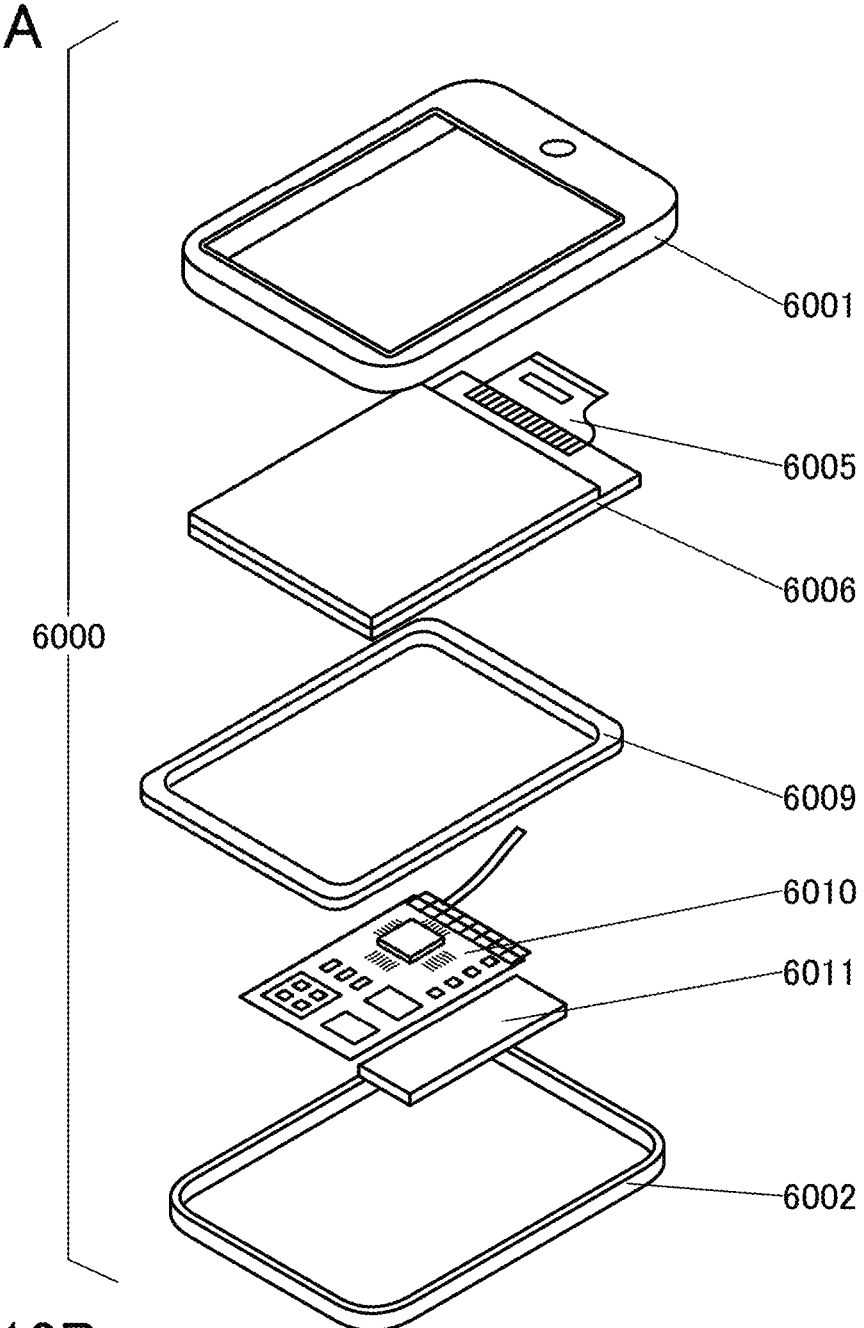
FIG. 13A and FIG. 13B are diagrams illustrating a structure example of a display module.

In a display module 6000 illustrated in FIG. 13A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 13B:
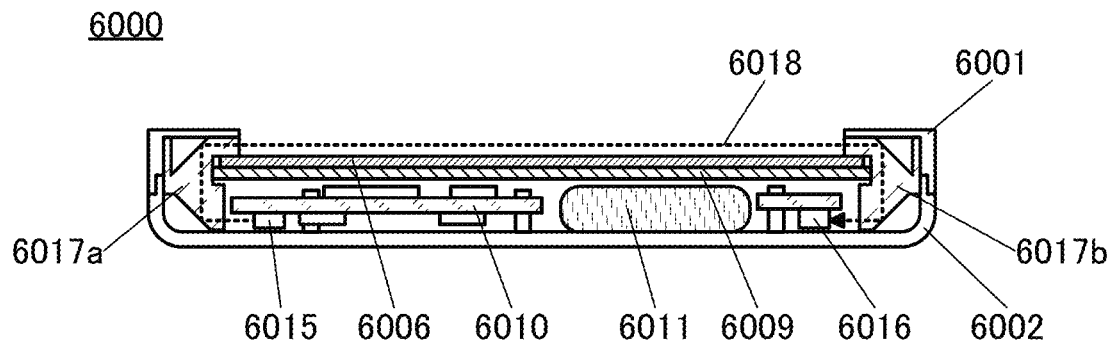

FIG. 13B is a schematic cross-sectional view of the display module 6000 in the case where an optical touch sensor is included.

The display module 6000 includes a light-emitting portion 6015 and a light-receiving portion 6016 that are provided on the printed circuit board 6010. Furthermore, a pair of light guide portions (a light guide portion 6017a and a light guide portion 6017*b*) are provided in regions surrounded by the upper cover 6001 and the lower cover 6002.

The display device 6006 overlaps with the printed circuit board 6010, the battery 6011, and the like with the frame 6009 therebetween. The display device 6006 and the frame 6009 are fixed to the light guide portion 6017*a* and the light guide portion 6017*b*.

Light 6018 emitted from the light-emitting portion 6015 travels over the display device 6006 through the light guide portion 6017*a* and reaches the light-receiving portion 6016 through the light guide portion 6017*b*. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

The light guide portion 6017*a* and the light guide portion 6017*b* which control the path of the light 6018 allow the light-emitting portion 6015 and the light-receiving portion 6016 to be placed under the display device 6006, inhibiting a malfunction of the touch sensor due to external light reaching the light-receiving portion 6016. Particularly when a resin that absorbs visible light and transmits infrared rays is used, a malfunction of the touch sensor can be inhibited more effectively.

At least part of this embodiment can be implemented in combination with the other embodiments described in this specification as appropriate.

Embodiment 4

In this embodiment, examples of an electronic device for which the display device of one embodiment of the present invention can be used are described.

Figure 14A:
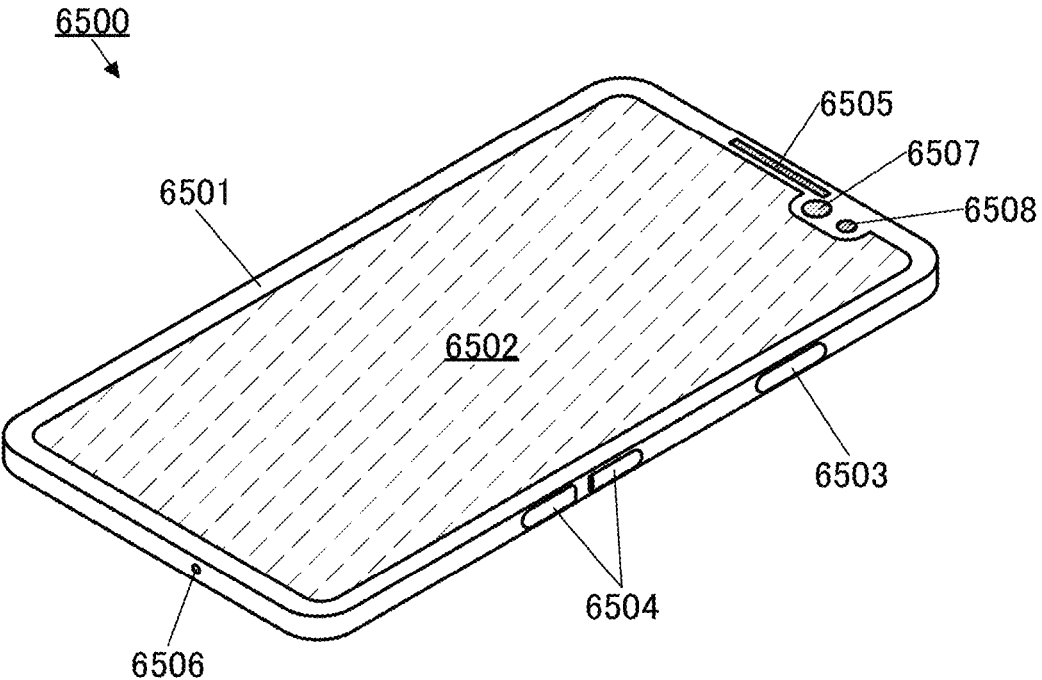
FIG. 14A and FIG. 14B are diagrams illustrating a structure example of an electronic device.

An electronic device 6500 illustrated in FIG. 14A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 14B:
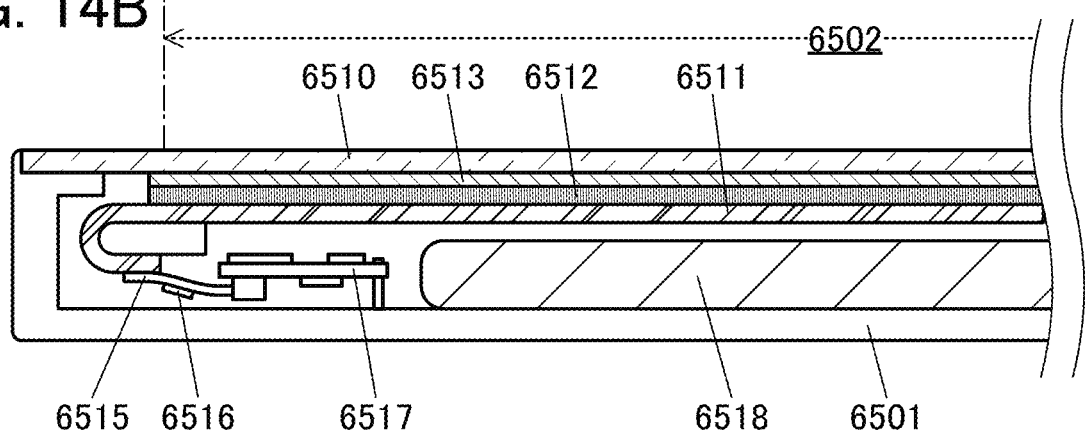

FIG. 14B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be obtained. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with the other embodiments described in this specification as appropriate.

Embodiment 5

In this embodiment, electronic devices each including a display device fabricated using one embodiment of the present invention are described.

Electronic devices described below as examples each include a display device of one embodiment of the present invention in a display portion. Thus, the electronic devices achieve high resolution. In addition, the electronic devices can each achieve both high resolution and a large screen.

A display portion in an electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a notebook personal computer, a monitor device, digital signage, a pachinko machine, and a game machine.

An electronic device using one embodiment of the present invention can be incorporated along a flat surface or a curved surface of an inside wall or an outside wall of a house or a building, an interior or an exterior of a car, or the like.

Figure 15A:
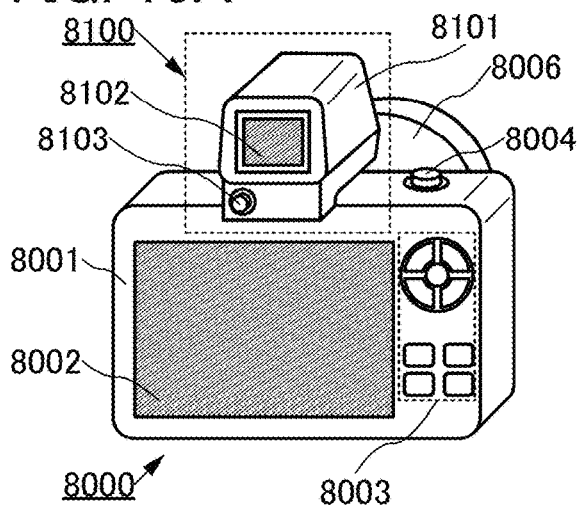
FIG. 15A to FIG. 15E are diagrams illustrating structure examples of electronic devices.

FIG. 15A is a diagram illustrating appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display device of one embodiment of the present invention can be used for the display portion 8002 of the camera 8000 and the display portion 8102 of the finder 8100. Note that a finder may be incorporated in the camera 8000.

Figure 15B:
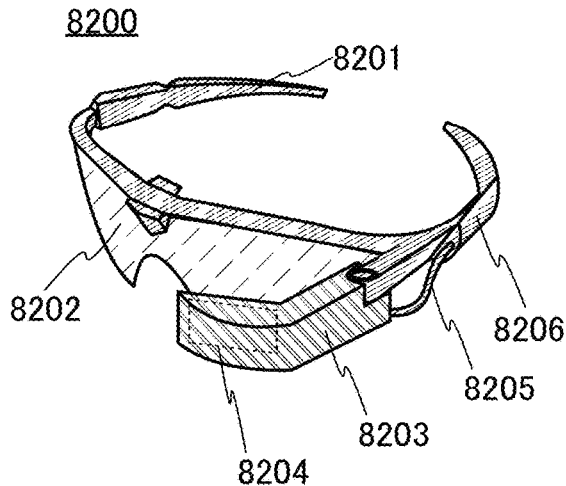

FIG. 15B is a diagram illustrating appearance of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display device of one embodiment of the present invention can be used for the display portion 8204.

Figure 15C:
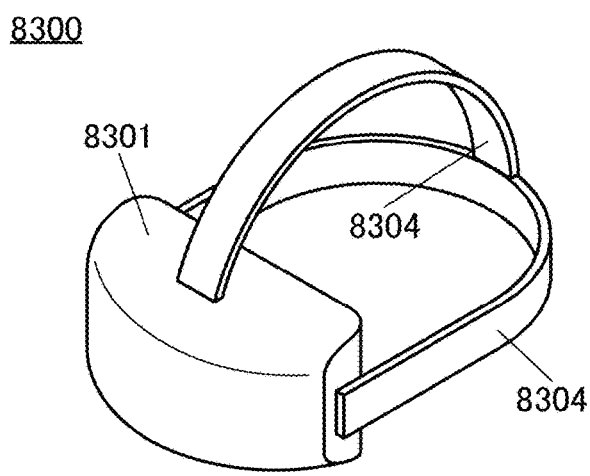
Figure 15D:
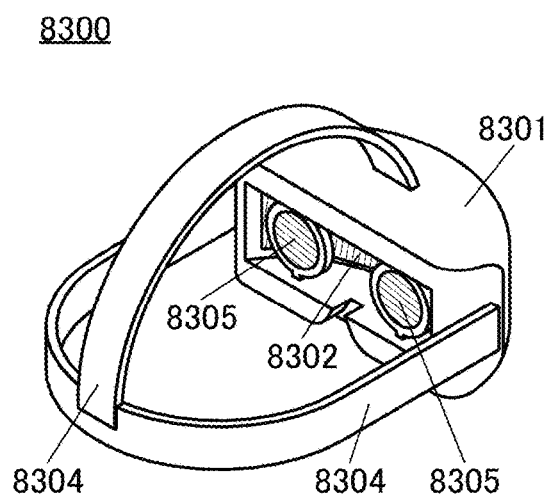
Figure 15E:
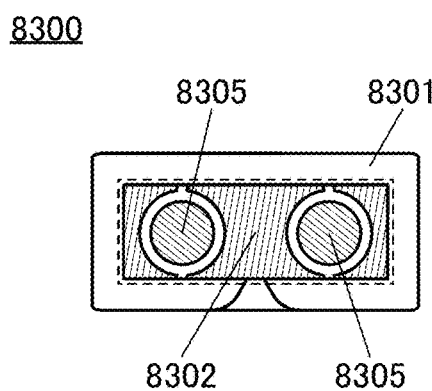

FIG. 15C, FIG. 15D, and FIG. 15E are diagrams illustrating appearance of a head-mounted display 8300. The head-mounted display 8300 includes a housing 8301, a display portion 8302, band-shaped fixing units 8304, and a pair of lenses 8305.

A user can see display on the display portion 8302 through the lenses 8305. Note that the display portion 8302 is preferably curved and placed because the user can feel a high realistic sensation. In addition, when another image displayed on a different region of the display portion 8302 is viewed through the lenses 8305, three-dimensional display using parallax or the like can also be performed. Note that the number of display portions 8302 provided is not limited to one; two display portions 8302 may be provided so that one display portion is provided for one eye of the user.

Note that the display device of one embodiment of the present invention can be used in the display portion 8302. The display device including the semiconductor device of one embodiment of the present invention has an extremely high resolution; thus, even when a video is magnified by the lenses 8305 as in FIG. 15E, the user does not perceive pixels, and a more realistic video can be displayed.

Electronic devices illustrated in FIG. 16A to FIG. 16G include a housing 9000, a display portion 9001, a speaker 9003, an operation key 9005 (including a power switch or an operation switch), a connection terminal 9006, a sensor 9007 (a sensor having a function of measuring force, displacement, a position, speed, acceleration, angular velocity, rotational frequency, distance, light, liquid, magnetism, temperature, a chemical substance, sound, time, hardness, an electric field, current, voltage, power, radiation, flow rate, humidity, a gradient, oscillation, an odor, or infrared rays), a microphone 9008, and the like.

The electronic devices illustrated in FIG. 16A to FIG. 16G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of reading out and processing a program or data stored in a recording medium, and the like. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 16A to FIG. 16G are described below.

Figure 16A:
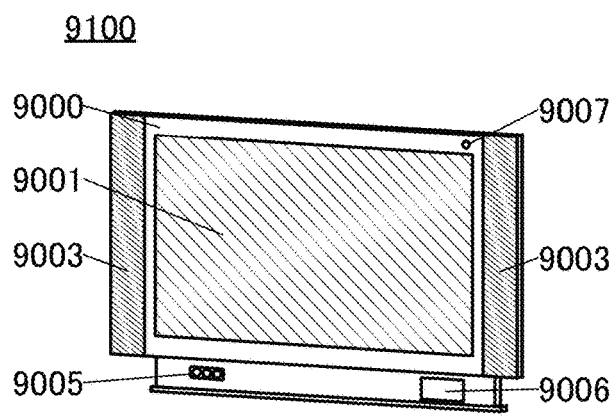
FIG. 16A to FIG. 16G are diagrams illustrating structure examples of electronic devices.

FIG. 16A is a perspective view illustrating a television device 9100. The display portion 9001 having a large screen size of, for example, 50 inches or more, or 100 inches or more can be incorporated in the television device 9100.

Figure 16D:
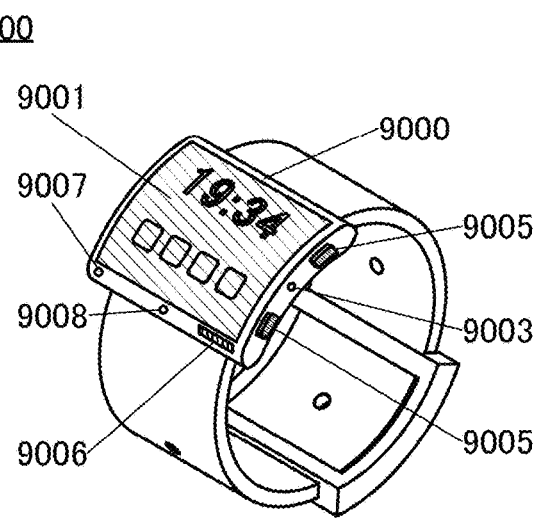
Figure 16B:
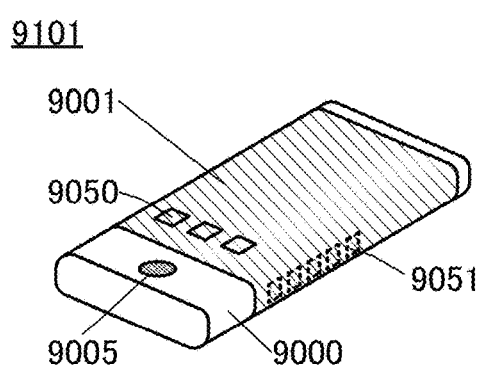

FIG. 16B is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display text or image information on its plurality of surfaces. FIG. 16B illustrates an example in which three icons 9050 are displayed. Furthermore, information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in a position where the information 9051 is displayed.

Figure 16E:
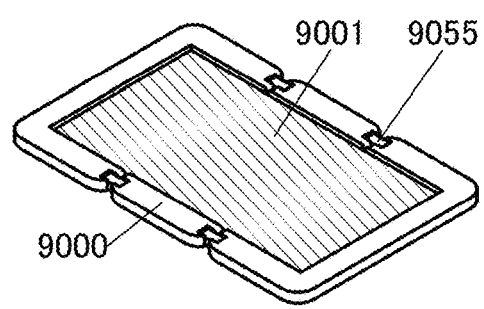
Figure 16C:
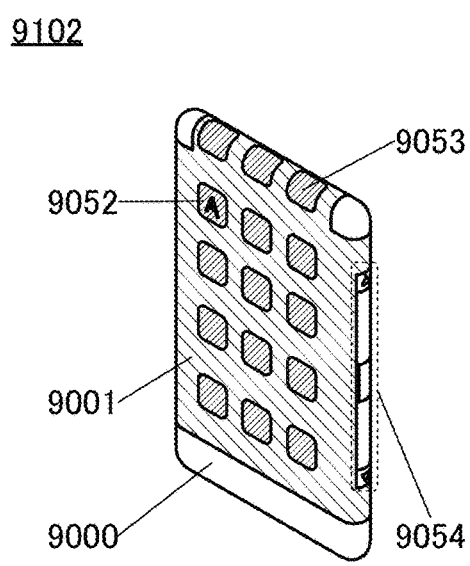

FIG. 16C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

FIG. 16D is a perspective view illustrating a watch-type portable information terminal 9200. In addition, a display surface of the display portion 9001 is curved and provided, and display can be performed along the curved display surface. Furthermore, intercommunication between the portable information terminal 9200 and, for example, a headset capable of wireless communication enables hands-free calling. Moreover, with the connection terminal 9006, the portable information terminal 9200 can also perform mutual data transmission with another information terminal or charging. Note that charging operation may be performed by wireless power feeding.

Figure 16F:
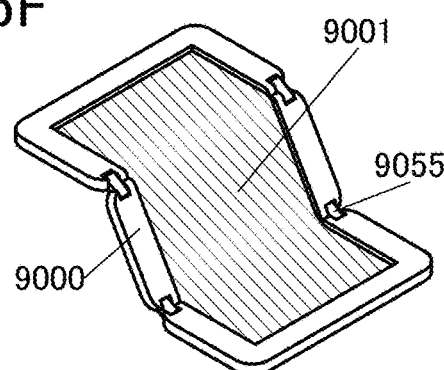
Figure 16G:
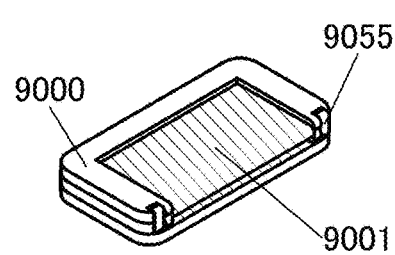

FIG. 16E, FIG. 16F, and FIG. 16G are perspective views illustrating a foldable portable information terminal 9201. In addition, FIG. 16E is a perspective view of an unfolded state of the portable information terminal 9201, FIG. 16G is a perspective view of a folded state thereof, and FIG. 16F is a perspective view of a state in the middle of change from one of FIG. 16E and FIG. 16G to the other. The portable information terminal 9201 is highly portable in the folded state and is highly browsable in the unfolded state because of a seamless large display region. The display portion 9001 of the portable information terminal 9201 is supported by three housings 9000 joined with hinges 9055. For example, the display portion 9001 can be bent with a radius of curvature greater than or equal to 1 mm and less than or equal to 150 mm.

Figure 17A:
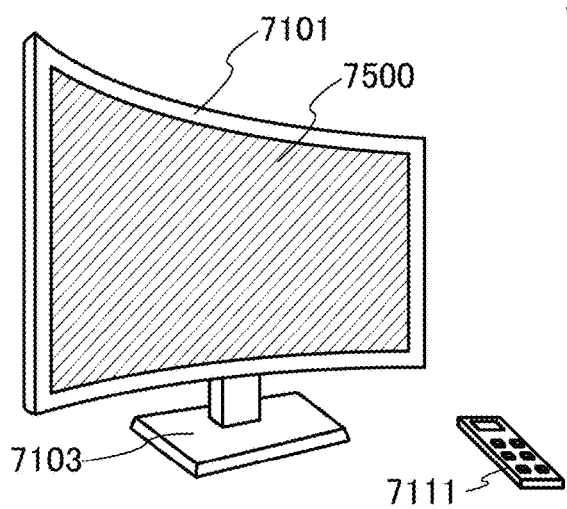
FIG. 17A to FIG. 17D are diagrams illustrating structure examples of electronic devices.

FIG. 17A illustrates an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 17A can be performed not only with an operation switch provided in the housing 7101 but also with a separate remote controller 7111. Alternatively, a touch panel may be used for the display portion 7500, and the television device 7100 may be operated by touch on the touch panel. The remote controller 7111 may include a display portion in addition to operation buttons.

Note that the television device 7100 may include not only a television receiver but also a communication device for network connection.

Figure 17B:
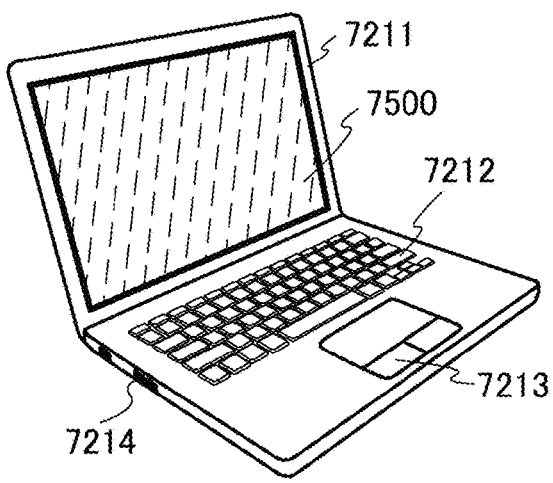

FIG. 17B illustrates a notebook personal computer 7200. The notebook personal computer 7200 includes a housing 7211, a keyboard 7212, a pointing device 7213, an external connection port 7214, and the like. The display portion 7500 is incorporated in the housing 7211.

Figure 17C:
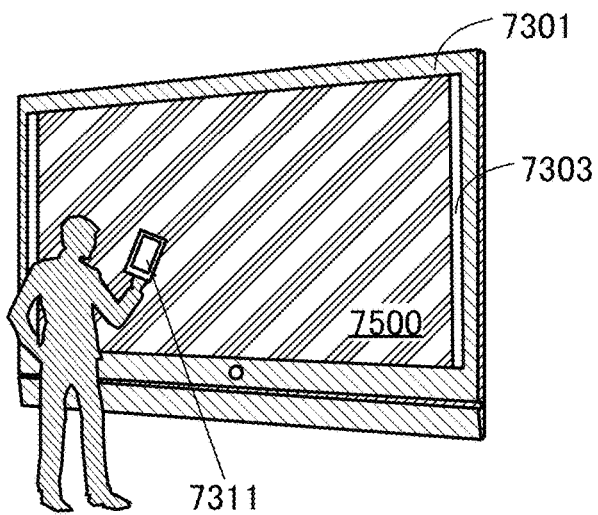
Figure 17D:
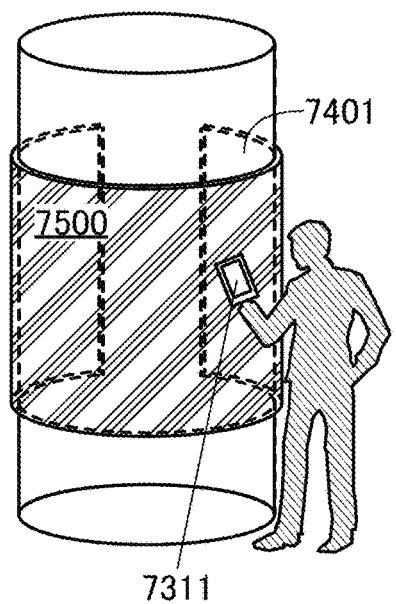

FIG. 17C and FIG. 17D illustrate examples of digital signage.

Digital signage 7300 illustrated in FIG. 17C includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 17D is digital signage 7400 attached to a cylindrical pillar 7401. The digital signage 7400 includes the display portion 7500 provided along a curved surface of the pillar 7401.

The larger display portion 7500 can increase the amount of information that can be provided at a time and attracts more attention, so that the effectiveness of the advertisement can be increased, for example.

A touch panel is preferably used for the display portion 7500 so that the user can operate the digital signage. Thus, the digital signage can be used not only for advertising but also for providing information that the user needs, such as route information, traffic information, or guidance information on a commercial facility.

As illustrated in FIG. 17C and FIG. 17D, it is preferable that the digital signage 7300 or the digital signage 7400 can work with an information terminal 7311 such as a user's smartphone through wireless communication. For example, not only displaying information of an advertisement displayed on the display portion 7500 on a screen of the information terminal 7311 but also switching display on the display portion 7500 by operation of the information terminal 7311 is possible.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used for the display portion 7500 in FIG. 17A to FIG. 17D.

At least part of this embodiment can be implemented in combination with the other embodiments described in this specification as appropriate.

REFERENCE NUMERALS

LIN, RIN, RES, CLK: signal: IN: input terminal: OUT: output terminal: OUTA, OUTB: output terminal: SP: signal: GD, SD: driver circuit: 10, 10*a* to 10*i*: sequential circuit: 11 to 13: circuit: 15*a*, 15*b*: wiring: 21, 22, 23: transistor: 24*n*, 24*p*: transistor: 25, 26: transistor: 30: sequential circuit: 31 to 34: transistor: 40, 40*a*: driver circuit: 41 to 47: transistor: 51: semiconductor layer: 51*p*: low-resistance region: 52: gate insulating layer: 53: gate electrode: 54*a*: conductive layer: 54*b*: conductive layer: 54*c*: conductive layer: 56*n*: low-resistance region: 56: semiconductor layer: 57: gate insulating layer: 58: gate electrode: 60 to 64: insulating layer: 70: display device: 71 to 73: transistor: 74: light-emitting element: 80: inverter circuit: 81: transistor: 82: transistor: 301: substrate: 310, 310*a*: transistor: 311: semiconductor layer: 311*i*: channel formation region: 311*n*: resistance region: 311*p*: resistance region: 312: insulating layer: 313: conductive layer: 314*a* to 314*d*: conductive layer: 315: conductive layer: 316: insulating layer: 321, 322: insulating layer: 326: insulating layer: 350, 350*a*: transistor: 351: semiconductor layer: 352: insulating layer: 353*a*, 353*b*: conductive layer

The invention claimed is:
1. A semiconductor device comprising:
 a pixel; and
 a gate driver circuit, wherein the gate driver circuit comprises:
  a first transistor; and
  a second transistor,
 wherein the first transistor is a p-channel transistor,
 wherein the second transistor is an n-channel transistor,
 wherein a gate of the first transistor is electrically connected to a first wiring,
 wherein one of a source and a drain of the first transistor is electrically connected to a second wiring to which a first potential is supplied,
 wherein the other of the source and the drain of the first transistor is electrically connected to one of a source and a drain of the second transistor and a first output terminal,
 wherein the first output terminal is electrically connected to a first gate line,
 wherein a gate of the second transistor is electrically connected to the first wiring,
 wherein the other of the source and the drain of the second transistor is electrically connected to a third wiring to which a second potential is supplied,
 wherein the first potential is higher than the second potential,
 wherein the pixel comprises a sixth transistor, a seventh transistor, and a light-emitting element, wherein the sixth transistor is a p-channel transistor,
wherein the seventh transistor is an n-channel transistor,
wherein the sixth transistor and the seventh transistor are electrically connected in series,
wherein one of a source and a drain of the sixth transistor is electrically connected to the light-emitting element,
wherein one of a source and a drain of the seventh transistor is electrically connected to the light-emitting element,
wherein a gate of the seventh transistor is electrically connected to the first gate line,
wherein the semiconductor device further comprises:
  a first semiconductor layer over a first insulating layer;
  a second insulating layer over the first semiconductor layer;
  a third insulating layer over the gate of the first transistor;
  a second semiconductor layer over the third insulating layer; and
  a fourth insulating layer over the second semiconductor layer,
wherein the first semiconductor layer comprises polycrystalline silicon,
wherein the first semiconductor layer comprises a channel formation region of the first transistor,
wherein the gate of the first transistor is provided over the second insulating layer,
wherein the second semiconductor layer comprises a channel formation region of the second transistor,
wherein the second semiconductor layer comprises a metal oxide,
wherein the metal oxide comprises indium, and
wherein the gate of the second transistor is provided over the fourth insulating layer.

2. The semiconductor device according to claim 1, further comprising a fifth insulating layer over the gate of the second transistor,
wherein the fifth insulating layer is in contact with a top surface and a side surface of the gate of the second transistor, a side surface of the fourth insulating layer, and a top surface of the second semiconductor layer.

3. The semiconductor device according to claim 1, wherein the second semiconductor layer comprises a nanocrystal.

4. The semiconductor device according to claim 1,
wherein the other of the source and the drain of the sixth transistor is electrically connected to a fifth wiring, and
wherein the other of the source and the drain of the seventh transistor is electrically connected to the fifth wiring.

5. A semiconductor device comprising:
a pixel; and
a gate driver circuit,
wherein the gate driver circuit comprises:
  a first transistor;
  a second transistor;
  a third transistor;
  a fourth transistor;
  a fifth transistor; and
  a capacitor,
wherein the first transistor is a p-channel transistor,
wherein the second transistor is an n-channel transistor,
wherein a gate of the first transistor is electrically connected to a first wiring,
wherein one of a source and a drain of the first transistor is electrically connected to a second wiring to which a first potential is supplied,
wherein the other of the source and the drain of the first transistor is electrically connected to one of a source and a drain of the second transistor and a first output terminal,
wherein the first output terminal is electrically connected to a first gate line,
wherein a gate of the second transistor is electrically connected to the first wiring,
wherein the other of the source and the drain of the second transistor is electrically connected to a third wiring to which a second potential is supplied,
wherein the first potential is higher than the second potential,
wherein one of a source and a drain of the third transistor is electrically connected to the first wiring,
wherein the other of the source and the drain of the third transistor is electrically connected to a gate of the fourth transistor,
wherein one of a source and a drain of the fourth transistor is electrically connected to a fourth wiring to which a clock signal is supplied,
wherein one electrode of the capacitor is electrically connected to the gate of the fourth transistor and the other of the source and the drain of the third transistor,
wherein the other electrode of the capacitor is electrically connected to the other of the source and the drain of the fourth transistor, one of a source and a drain of the fifth transistor, and a second output terminal,
wherein the second output terminal is electrically connected to a second gate line,
wherein the pixel comprises a sixth transistor, a seventh transistor, a light-emitting element, and an eighth transistor,
wherein the sixth transistor is a p-channel transistor,
wherein the seventh transistor is an n-channel transistor,
wherein the sixth transistor and the seventh transistor are electrically connected in series,
wherein one of a source and a drain of the sixth transistor is electrically connected to the light-emitting element,
wherein one of a source and a drain of the seventh transistor is electrically connected to the light-emitting element,
wherein a gate of the seventh transistor is electrically connected to the first gate line,
wherein one of a source and a drain of the eighth transistor is electrically connected to a signal line,
wherein a gate of the eighth transistor is electrically connected to the second gate line,
wherein the semiconductor device further comprises:
  a first semiconductor layer over a first insulating layer;
  a second insulating layer over the first semiconductor layer;
  a third insulating layer over the gate of the first transistor;
  a second semiconductor layer over the third insulating layer; and
  a fourth insulating layer over the second semiconductor layer,
wherein the first semiconductor layer comprises polycrystalline silicon,
wherein the first semiconductor layer comprises a channel formation region of the first transistor,
wherein the gate of the first transistor is provided over the second insulating layer,
wherein the second semiconductor layer comprises a channel formation region of the second transistor, wherein the second semiconductor layer comprises a metal oxide,
wherein the metal oxide comprises indium, and
wherein the gate of the second transistor is provided over the fourth insulating layer.

6. The semiconductor device according to claim 5, further comprising a fifth insulating layer over the gate of the second transistor,
wherein the fifth insulating layer is in contact with a top surface and a side surface of the gate of the second transistor, a side surface of the fourth insulating layer, and a top surface of the second semiconductor layer.

7. The semiconductor device according to claim 5, wherein the second semiconductor layer comprises a nanocrystal.

8. The semiconductor device according to claim 5,
wherein the other of the source and the drain of the sixth transistor is electrically connected to a fifth wiring, and
wherein the other of the source and the drain of the seventh transistor is electrically connected to the fifth wiring.

9. A semiconductor device comprising:
a pixel; and
a gate driver circuit,
wherein the gate driver circuit comprises:
 a first transistor;
 a second transistor;
 a third transistor;
 a fourth transistor;
 a fifth transistor; and
 a capacitor,
wherein the first transistor is a p-channel transistor,
wherein the second transistor is an n-channel transistor,
wherein a gate of the first transistor is electrically connected to a first wiring,
wherein one of a source and a drain of the first transistor is electrically connected to a second wiring to which a first potential is supplied,
wherein the other of the source and the drain of the first transistor is electrically connected to one of a source and a drain of the second transistor and a first output terminal,
wherein the first output terminal is electrically connected to a first gate line,
wherein a gate of the second transistor is electrically connected to the first wiring,
wherein the other of the source and the drain of the second transistor is electrically connected to a third wiring to which a second potential is supplied,
wherein the first potential is higher than the second potential,
wherein one of a source and a drain of the third transistor is electrically connected to the first wiring,
wherein the other of the source and the drain of the third transistor is electrically connected to a gate of the fourth transistor,
wherein one of a source and a drain of the fourth transistor is electrically connected to a fourth wiring to which a clock signal is supplied,
wherein one electrode of the capacitor is electrically connected to the gate of the fourth transistor and the other of the source and the drain of the third transistor,
wherein the other electrode of the capacitor is electrically connected to the other of the source and the drain of the fourth transistor, one of a source and a drain of the fifth transistor, and a second output terminal,
wherein the second output terminal is electrically connected to a second gate line,
wherein the second transistor comprises a back gate,
wherein the back gate of the second transistor is electrically connected to the gate of the second transistor,
wherein the pixel comprises a sixth transistor, a seventh transistor, a light-emitting element, and an eighth transistor,
wherein the sixth transistor is a p-channel transistor,
wherein the seventh transistor is an n-channel transistor,
wherein the sixth transistor and the seventh transistor are electrically connected in series,
wherein one of a source and a drain of the sixth transistor is electrically connected to the light-emitting element,
wherein one of a source and a drain of the seventh transistor is electrically connected to the light-emitting element,
wherein a gate of the seventh transistor is electrically connected to the first gate line,
wherein one of a source and a drain of the eighth transistor is electrically connected to a signal line,
wherein a gate of the eighth transistor is electrically connected to the second gate line,
wherein the semiconductor device further comprises:
 a first semiconductor layer over a first insulating layer;
 a second insulating layer over the first semiconductor layer;
 a third insulating layer over the gate of the first transistor;
 a second semiconductor layer over the third insulating layer; and
 a fourth insulating layer over the second semiconductor layer,
wherein the first semiconductor layer comprises polycrystalline silicon,
wherein the first semiconductor layer comprises a channel formation region of the first transistor,
wherein the gate of the first transistor is provided over the second insulating layer,
wherein the second semiconductor layer comprises a channel formation region of the second transistor,
wherein the second semiconductor layer comprises a metal oxide,
wherein the metal oxide comprises indium, and
wherein the gate of the second transistor is provided over the fourth insulating layer.

10. The semiconductor device according to claim 9, further comprising a fifth insulating layer over the gate of the second transistor,
wherein the fifth insulating layer is in contact with a top surface and a side surface of the gate of the second transistor, a side surface of the fourth insulating layer, and a top surface of the second semiconductor layer.

11. The semiconductor device according to claim 9, wherein the second semiconductor layer comprises a nanocrystal.

12. The semiconductor device according to claim 9,
wherein the other of the source and the drain of the sixth transistor is electrically connected to a fifth wiring, and
wherein the other of the source and the drain of the seventh transistor is electrically connected to the fifth wiring.

* * * * *